(12) United States Patent
Shibata

(10) Patent No.: US 7,679,959 B2
(45) Date of Patent: *Mar. 16, 2010

(54) SEMICONDUCTOR MEMORY DEVICE WHICH GENERATES VOLTAGES CORRESPONDING TO A PLURALITY OF THRESHOLD VOLTAGES

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

This patent is subject to a terminal disclaimer.

(21) Appl. No.: 12/276,957

(22) Filed: Nov. 24, 2008

(65) Prior Publication Data

US 2009/0073766 A1    Mar. 19, 2009

Related U.S. Application Data

(63) Continuation of application No. 11/447,983, filed on Jun. 7, 2006, now Pat. No. 7,460,402.

(30) Foreign Application Priority Data

Jun. 8, 2005    (JP)    ............... 2005-168290

(51) Int. Cl.
*G11C 11/34* (2006.01)
*G11C 16/04* (2006.01)

(52) U.S. Cl. .................. 365/185.17; 365/185.03; 365/185.24

(58) Field of Classification Search ............ 365/185.17, 365/185.03, 185.24, 185.22
See application file for complete search history.

(56) References Cited

U.S. PATENT DOCUMENTS 6,118,692 A    9/2000    Banks
6,243,290 B1    6/2001    Kurata et al.
6,657,891 B1    12/2003    Shibata et al.
6,667,904 B2    12/2003    Takeuchi et al.
6,707,715 B2    3/2004    Michael et al.
6,717,847 B2    4/2004    Chen
6,876,578 B2    4/2005    Shibata et al.
6,898,119 B2    5/2005    Imamiya et al.
6,925,004 B2    8/2005    Shibata et al.
7,460,402 B2 *    12/2008    Shibata .................. 365/185.17
2004/0057326 A1    3/2004    Ikehashi et al.
2005/0105334 A1    5/2005    Futatsuyama
2007/0121378 A1    5/2007    Shibata et al.

FOREIGN PATENT DOCUMENTS

| JP | 2001-110191 A | 4/2001 |
| JP | 2004-192789 | 7/2004 |
| KR | 2001-0094352 | 11/2001 |
| WO | WO 2004/093090 A1 | 10/2004 |

* cited by examiner

Primary Examiner—Anh Phung
Assistant Examiner—Toan Le
(74) Attorney, Agent, or Firm—Oblon, Spivak, McClelland, Maier & Neustadt, L.L.P.

(57) ABSTRACT

A memory cell MC stores a plurality of bits of data using threshold levels 1, 2, . . . , n (n is a natural number). A storage section stores a plurality of items of parameter data for generating the threshold levels. An arithmetic circuit generates voltage data for generating voltages corresponding to the threshold levels by accumulating the parameter data read from the storage section. A voltage generating circuit generates a voltage on the basis of the voltage data generated by the arithmetic circuit. The arithmetic circuit, when reading data from the memory cell at threshold level k (k<=n), generates the voltage data by accumulating parameter data at the threshold levels i to k (i<=k).

6 Claims, 19 Drawing Sheets

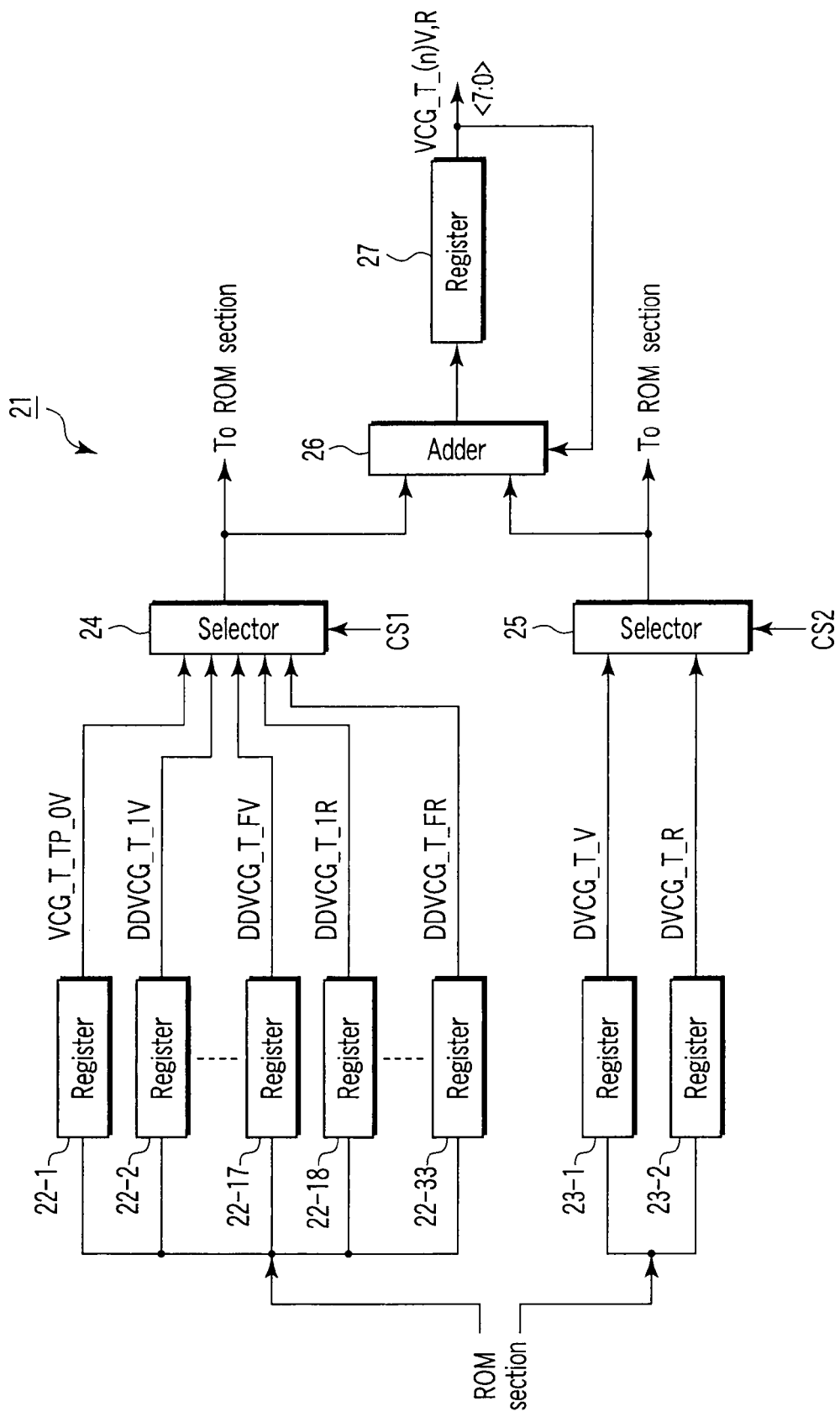
F I G. 1

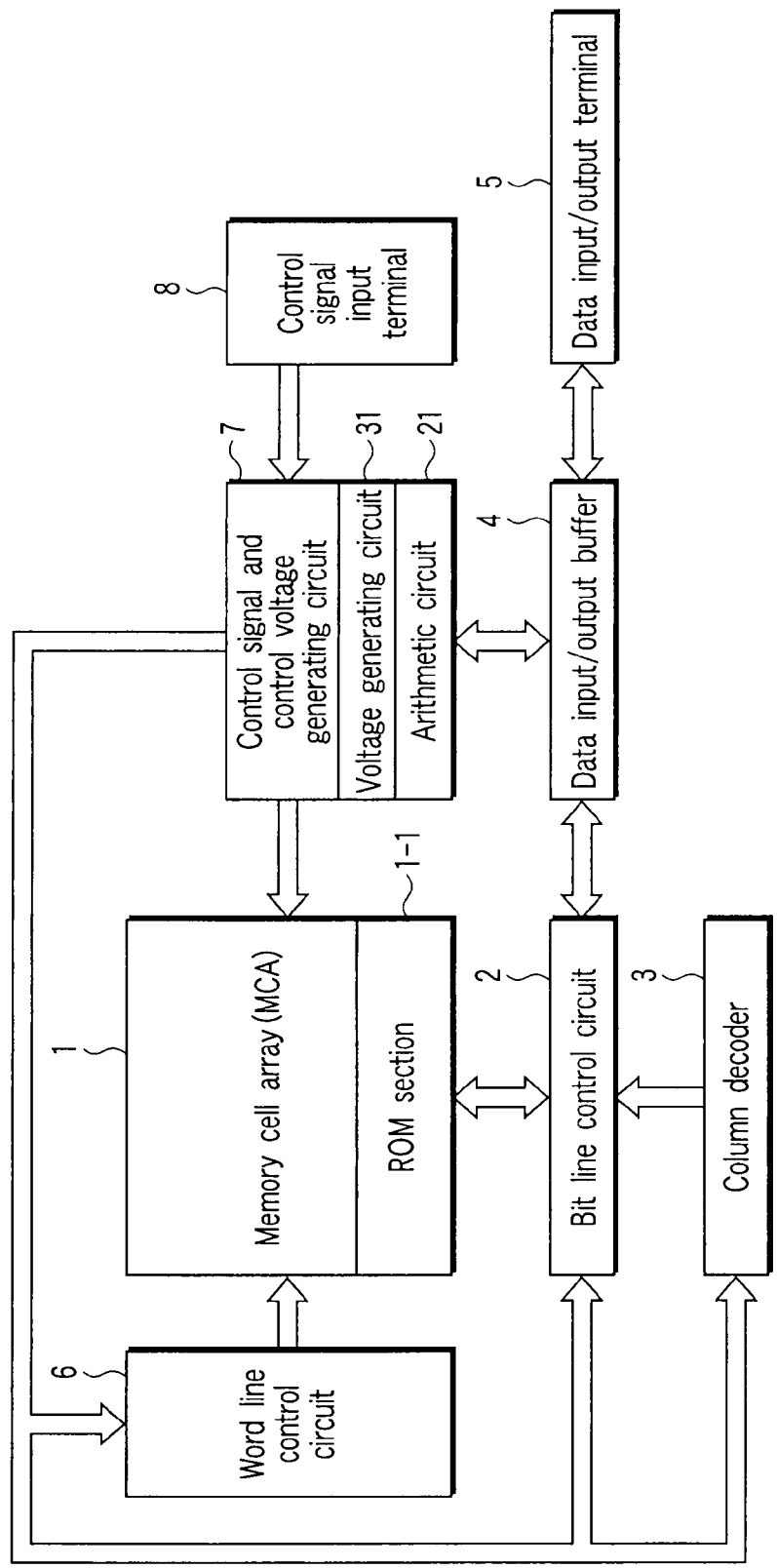
F I G. 2

Memory cell MC
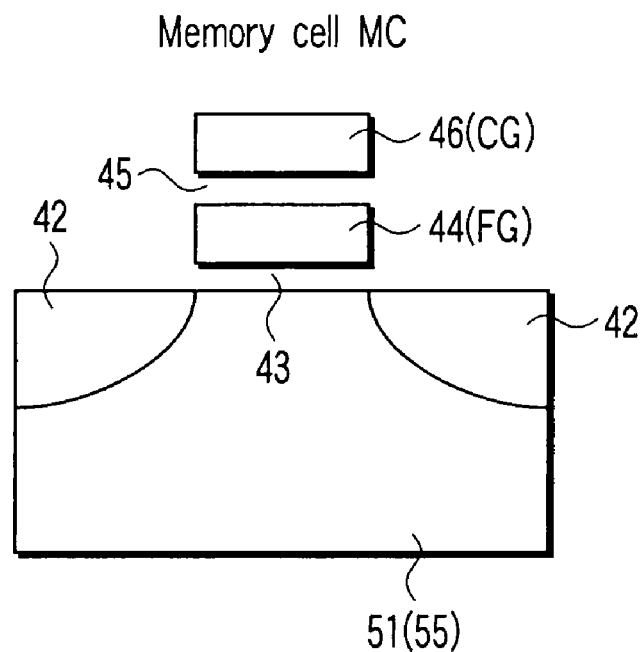
F I G. 4A
Select gate
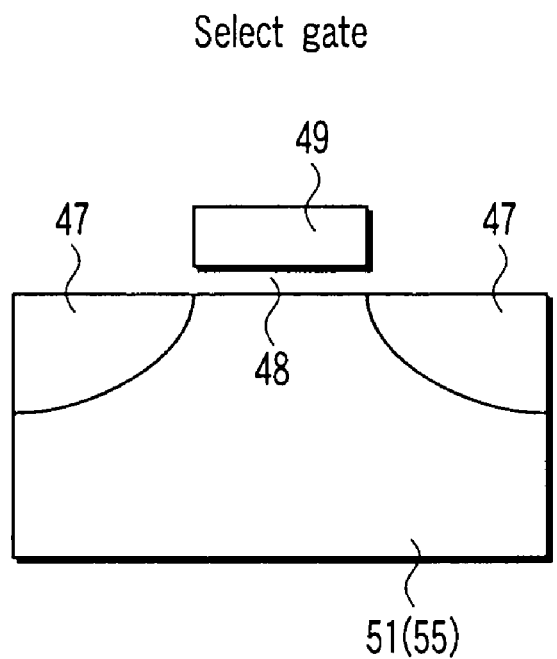
F I G. 4B

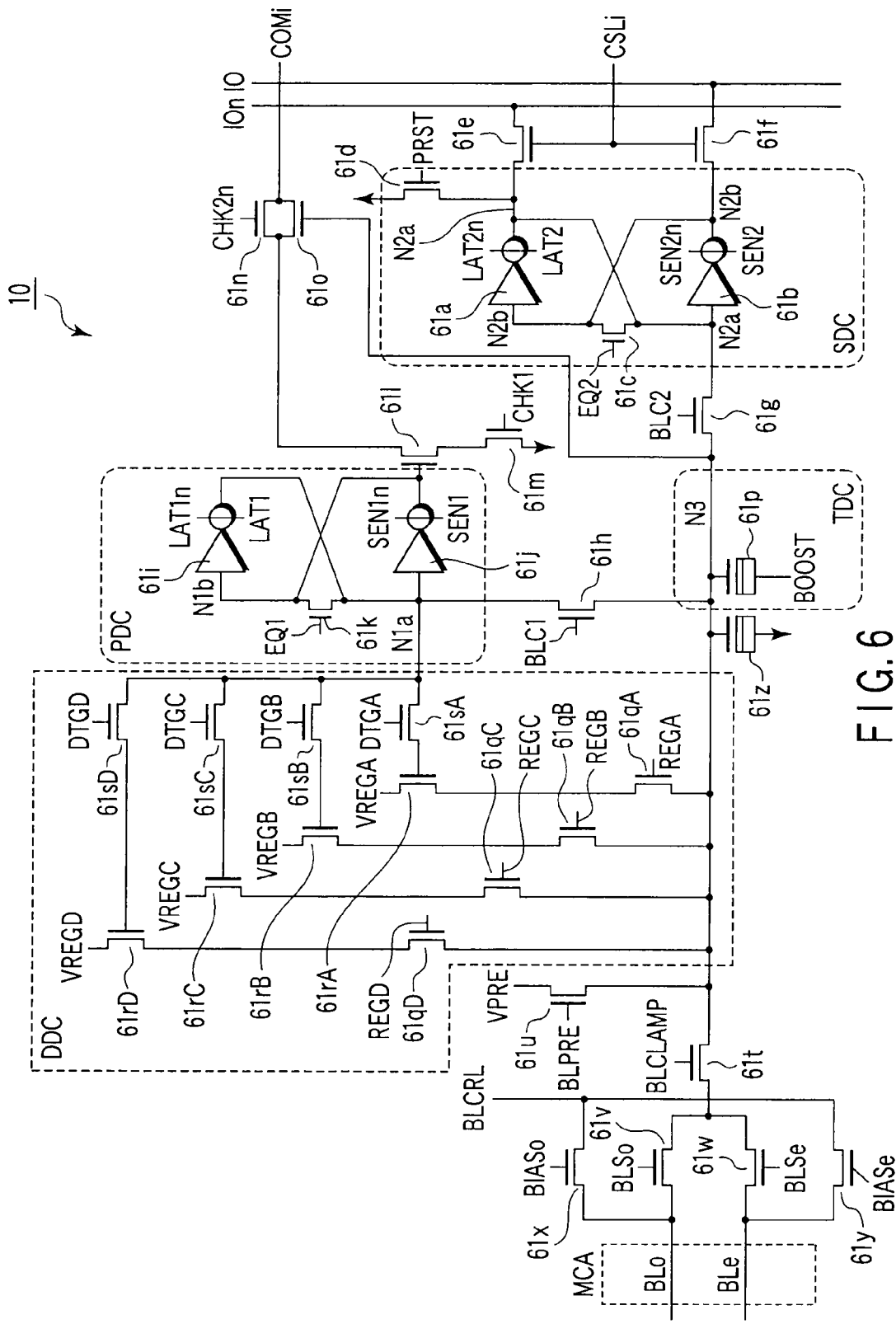
F I G. 6

| Level | Reading | Verify reading |
|---|---|---|
| 0 |  | VCG_T_PT_0V |
| 1 | VCG_T_1R=VCG_T_1V+DVCG_T_R+DDVCG_T_1R | VCG_T_1V=VCG_T_PT_0V+DVCG_T_V+DDVCG_T_1V |
| 2 | VCG_T_2R=VCG_T_2V+DVCG_T_R+DDVCG_T_2R | VCG_T_2V=VCG_T_1V+DVCG_T_V+DDVCG_T_2V |
| 3 | VCG_T_3R=VCG_T_3V+DVCG_T_R+DDVCG_T_3R | VCG_T_3V=VCG_T_2V+DVCG_T_V+DDVCG_T_3V |
| .... | .... | .... |
| F | VCG_T_FR=VCG_T_FV+DVCG_T_R+DDVCG_T_FR | VCG_T_FV=VCG_T_EV+DVCG_T_V+DDVCG_T_FV |
|  | DVCG_T_R(−0.375V to 0V / 25mV×2⁴)<br>DDVCG_T_1−FR(−0.375V to 0V / 25mV×2⁴) | VCG_T_PT_0V(0 to 0.375V / 25mV×2⁴)<br>DVCG_T_V(0.2 to 0.575V / 25mV×2⁴)<br>DDVCG_T_1−FV(0 to 0.375V / 25mV×2⁴) |

FIG. 8

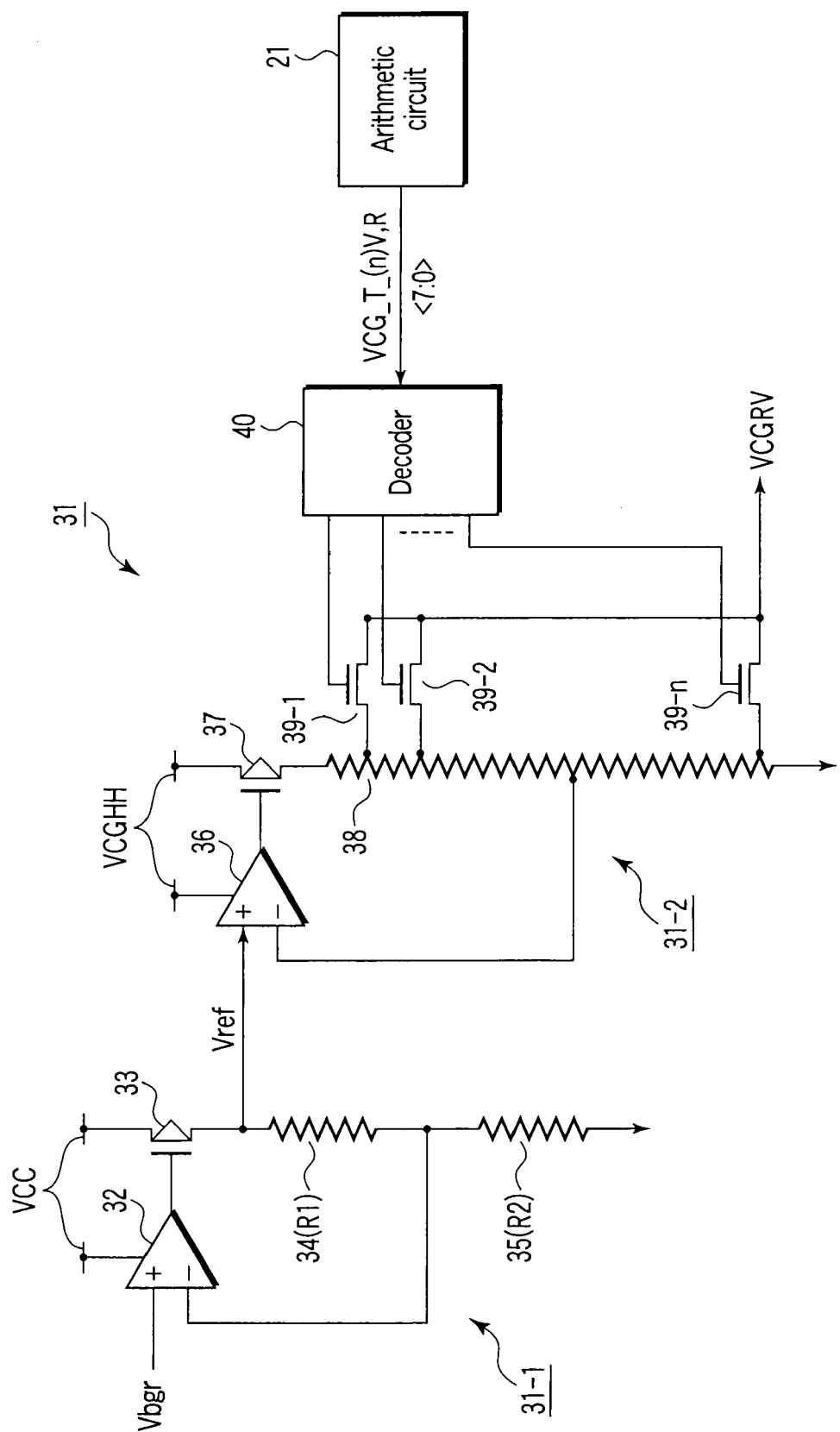
F I G. 11

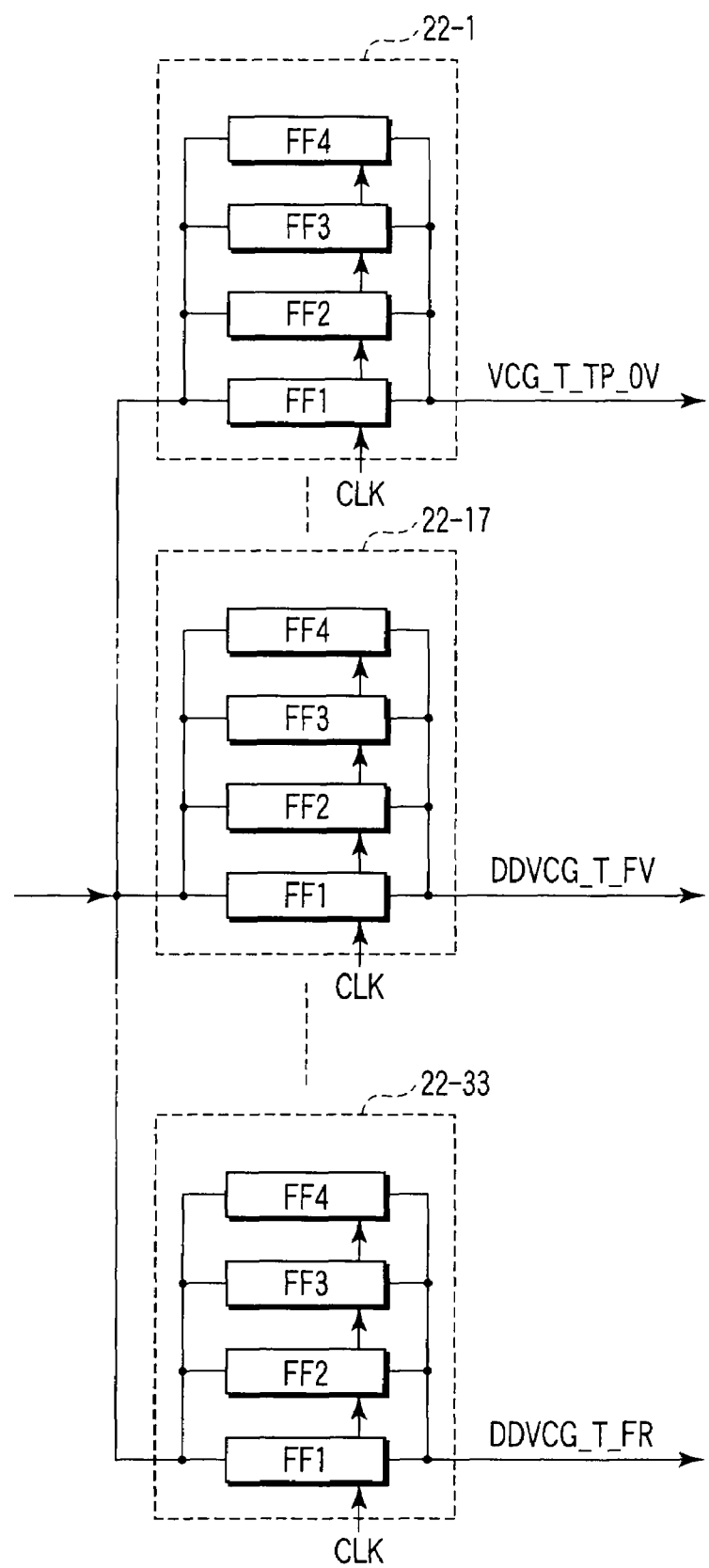
F I G. 15

| Level | Verify | Verify −0.4 | Verify +0.4 | Max. −Min. | (Ma.−Mi.)/ 50mV | Read | Verify −Read | (V−R) −0.4 | (V−R) +0.4 | Max. −Min. | (Ma.−Mi.)/ 50mV |
|---|---|---|---|---|---|---|---|---|---|---|---|
| 0 | | | | | | | | | | | |
| 1 | 0.5 | 0.30 | 0.70 | 0.40 | 8 | 0.3 | 0.20 | 0.1 | 0.3 | 0.16 | 3 |
| 2 | 1.05 | 0.63 | 1.47 | 0.84 | 17 | 0.8 | 0.25 | 0.2 | 0.4 | 0.20 | 4 |
| 3 | 1.65 | 1.05 | 2.31 | 1.26 | 25 | 1.35 | 0.30 | 0.2 | 0.4 | 0.24 | 5 |
| 4 | 2.3 | 1.65 | 3.22 | 1.57 | 31 | 1.95 | 0.35 | 0.2 | 0.5 | 0.28 | 6 |
| 5 | 3 | 2.30 | 4.20 | 1.90 | 38 | 2.6 | 0.40 | 0.2 | 0.6 | 0.32 | 6 |
| 6 | 3.75 | 3.00 | 5.25 | 2.25 | 45 | 3.3 | 0.45 | 0.3 | 0.6 | 0.36 | 7 |
| 7 | 4.55 | 3.75 | 6.37 | 2.62 | 52 | 4.05 | 0.50 | 0.3 | 0.7 | 0.40 | 8 |
F I G. 16A
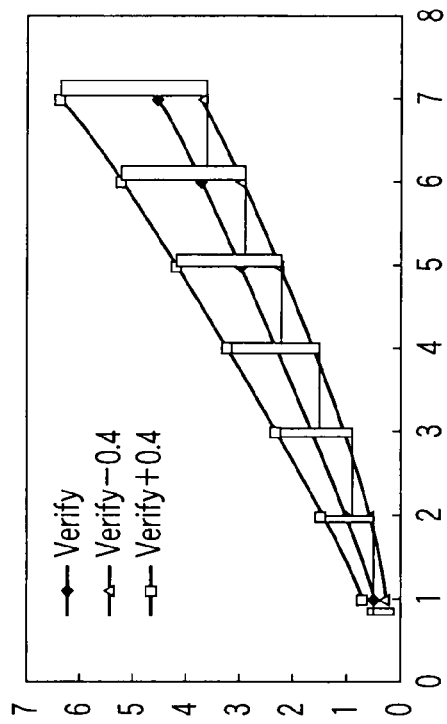
F I G. 16B

| Level | Verify | ×0.6 | ×0.8 | ×1.2 | ×1.4 |
|---|---|---|---|---|---|
| 0 | | | | | |
| 1 | 0.5 | 0.30 | 0.40 | 0.60 | 0.70 |
| 2 | 1.05 | 0.63 | 0.84 | 1.26 | 1.47 |
| 3 | 1.65 | 0.99 | 1.32 | 1.98 | 2.31 |
| 4 | 2.3 | 1.38 | 1.84 | 2.76 | 3.22 |
| 5 | 3 | 1.80 | 2.40 | 3.60 | 4.20 |
| 6 | 3.75 | 2.25 | 3.00 | 4.50 | 5.25 |
| 7 | 4.55 | 2.73 | 3.64 | 5.46 | 6.37 |

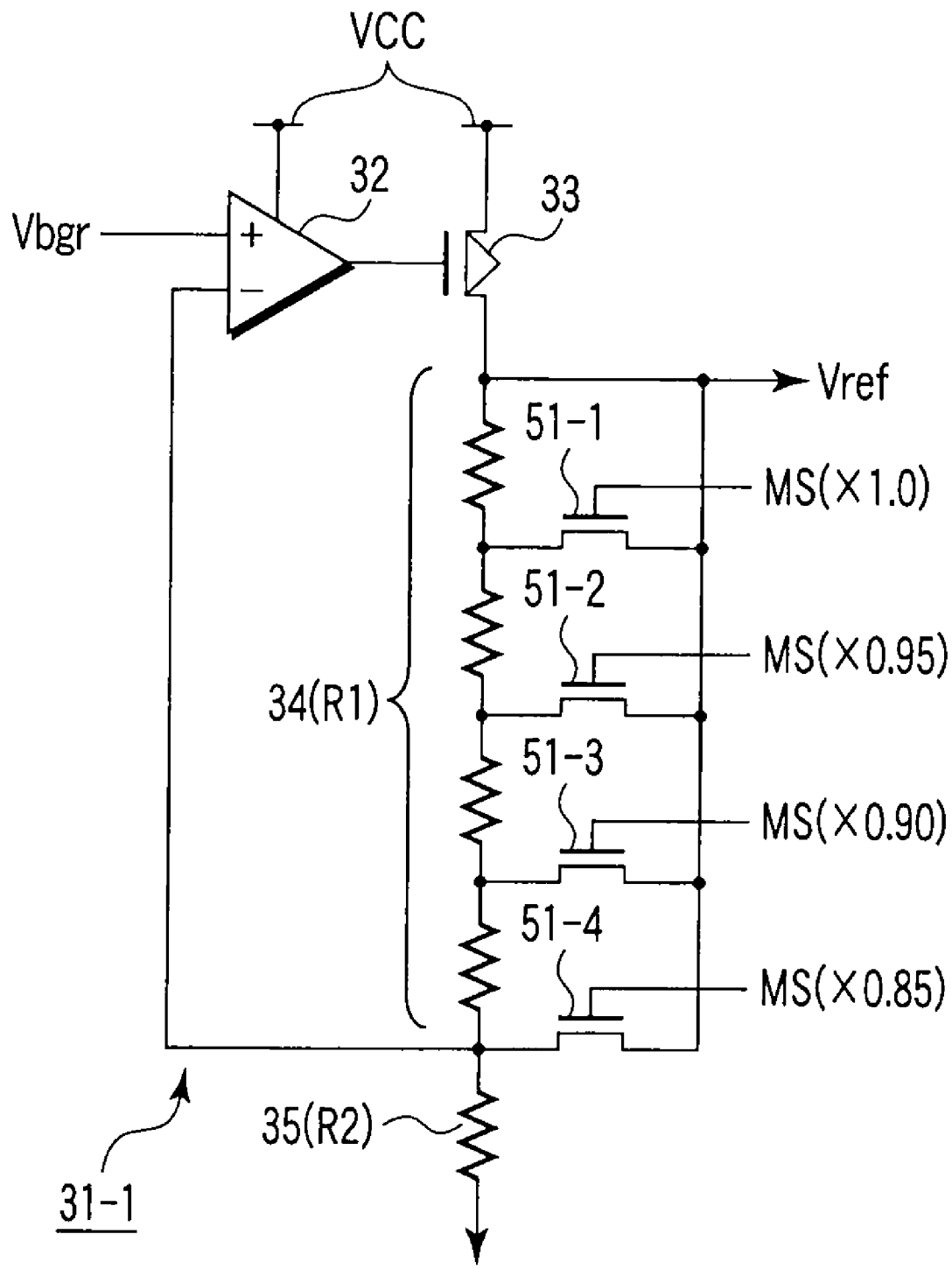
F I G. 20

SEMICONDUCTOR MEMORY DEVICE WHICH GENERATES VOLTAGES CORRESPONDING TO A PLURALITY OF THRESHOLD VOLTAGES

CROSS-REFERENCE TO RELATED APPLICATIONS

This application is a continuation of U.S. application Ser. No. 11/447,983, filed Jun. 7, 2006, now U.S. Pat. No. 7,460,402, and is based upon and claims the benefit of priority from prior Japanese Patent Application No. 2005-168290, filed Jun. 8, 2005, the entire contents of each of which are incorporated herein by reference.

BACKGROUND OF THE INVENTION

1. Field of the Invention

This invention relates to, for example, a NAND flash EEPROM, and more particularly to a semiconductor memory device capable of storing multivalued data in a single memory cell.

2. Description of the Related Art

A NAND flash EEPROM which stores multivalued data in a single memory cell requires a plurality of voltages corresponding to multivalued data. Specifically, in writing data, the NAND flash EEPROM requires a plurality of verify voltages to verify the write data. In reading data, it requires a plurality of read voltages corresponding to the read-out data (refer to, for example, Jpn. Pat. Appln. KOKAI Publication No. 2004-192789).

In a multivalued memory, the voltages corresponding to the individual threshold levels vary according to the performances of the individual chips. That is, variations in the manufacturing process cause the characteristics of the individual chips to differ, resulting in variations in the voltages corresponding to the individual threshold levels. Moreover, the voltage generating circuit which generates a verify voltage and a read voltage is also affected by variations in the manufacturing process. To overcome this drawback, the voltage generating circuit has a trimming circuit so as to be capable of generating the required voltage according to the characteristic of the memory cell, which makes it possible to generate an accurate voltage.

In a conventional multivalued memory, the verify voltage and read voltage are set in, for example, a die sort test. A plurality of items of trimming data (voltage data) for generating the voltages are stored in, for example, an EEPROM as electric fuses in the chip. The data stored in the EEPROM is read when the power supply for the chip is turned on. According to the data, the resistance values constituting the trimming circuit of the voltage generating circuit is set.

The trimming circuit, which generally has a resistance and a switch which changes the value of the resistance, causes the switch to change over, thereby changing the output voltage. The signal causing the switch to change over is generated by decoding the trimming data. In the trimming circuit, the smaller the variation in output voltage, the more the accuracy of the output voltage (or threshold level) can be improved. However, as a result of improving the accuracy of the output voltage, the number of trimming data items tends to increase. As described above, the trimming data is stored in EEPROM cells acting as electric fuses and held in registers. Therefore, an increase in the trimming data leads to an increase in the number of EEPROM cells and that of registers.

For example, when eight-valued data is stored in a single memory cell, threshold level 0 to threshold level 7 are needed. When eight-valued threshold levels are written in a memory cell, eight verify voltages are needed. For example, when the verify voltage for threshold level 7 is 4.55V, if the voltage trimming range is +40% to −40%, the voltage is in the range of 2.73V to 6.37V. when the voltage is trimmed at intervals of 50 mV, 73 parameters are required as trimming data.

Moreover, to read eight-valued threshold levels stored in the memory cell, eight read voltages are needed. When one read voltage is trimmed, for example, 65 parameters are needed as trimming data.

As described above, when the number of data items stored in a single memory is made large, the number of parameters for generating the verify voltage and read voltages becomes enormous. The number of EEPROM cells and registers to store the parameters also increases sharply, which causes a problem: the percentage of the area occupied by the EEPROM cells and registers increases. Accordingly, a semiconductor memory device has been desired which is capable of reducing remarkably the number of parameters for generating the read voltages corresponding to the threshold levels.

BRIEF SUMMARY OF THE INVENTION

According to a first aspect of the invention, there is provided a semiconductor memory device comprising: a memory cell which stores a plurality of bits of data using threshold levels $1, 2, \ldots, n$ (n is a natural number); a storage section which stores a plurality of items of parameter data for generating the threshold levels; an arithmetic circuit which calculates voltage data for generating voltages corresponding to the threshold levels by accumulating the parameter data read from the storage section; and a voltage generating circuit which generates a voltage on the basis of the voltage data calculated by the arithmetic circuit, wherein the arithmetic circuit, when reading data from the memory cell at threshold level k ($k<=n$), generates the voltage data by accumulating parameter data at the threshold levels i to k ($i<=k$)

According to a second aspect of the invention, there is provided a semiconductor memory device comprising: a memory cell array in which a plurality of memory cells connected to word lines and bit lines are arranged in a matrix; and a control circuit which controls the potentials on the word lines and the bit lines and which, in a read operation of reading data from the memory cells, activates the unselected word lines adjacent to the selected one of the word lines and then activates the selected word line.

According to a third aspect of the invention, there is provided a semiconductor memory device comprising: a memory cell array which includes NAND cells having a plurality of memory cells and a plurality of select gates connected in series; a voltage generating circuit which supplies a potential to the word lines of the NAND cells on the basis of a reference voltage; and a varying circuit which varies the potential of the reference voltage, wherein the varying circuit outputs a first reference voltage when a specific memory cell of the NAND cells is written into and outputs a second reference voltage different from the first reference voltage when a memory cell different from the specific memory cell is written into.

According to a fourth aspect of the invention, there is provided a semiconductor memory device comprising: a memory cell which stores data using threshold levels; an arithmetic circuit which adds first and second parameter data or subtracts one from the other, the first parameter data being data for generating a first level for first reading or verify reading and the second parameter data being data on the difference between a second level different from the first level and for second reading or verify reading and the first level; and a voltage generating circuit which generates a voltage on the basis of the voltage data calculated by the arithmetic circuit, wherein the voltage generating circuit generates a voltage on the basis of the first parameter data when reading data from the memory cell at the first level or performing verify reading, the arithmetic circuit adds parameter data of the first level and second parameter data about the difference between the first level and the second level, or subtracts one from the other, and the voltage generating circuit generates a voltage on the basis of the data obtained from the addition or subtraction.

BRIEF DESCRIPTION OF THE SEVERAL VIEWS OF THE DRAWING

FIG. 1 shows a configuration of an arithmetic circuit according to a first embodiment of the present invention;

FIG. 2 shows a configuration of a semiconductor memory device to which the present invention is applied;

FIG. 4A is a sectional view of a memory cell;

FIG. 4B is a sectional view of a select transistor;

FIG. 6 is a circuit diagram of the data storage circuit of FIG. 3;

FIG. 8 is a table to explain a method of generating threshold levels in a verify read operation and a read operation;

FIG. 11 is a circuit diagram of a voltage generating circuit according to the first embodiment;

FIG. 15 shows a configuration of the registers 22-1 to 22-33 of FIG. 1 in the first embodiment;

FIG. 16A shows the relationship between the verify voltage and the threshold level in the first embodiment;

FIG. 16B is a graph corresponding to FIG. 16A;

FIG. 20 is a circuit diagram of a reference voltage generating circuit applied to the third embodiment;

DETAILED DESCRIPTION OF THE INVENTION

Figure 3:
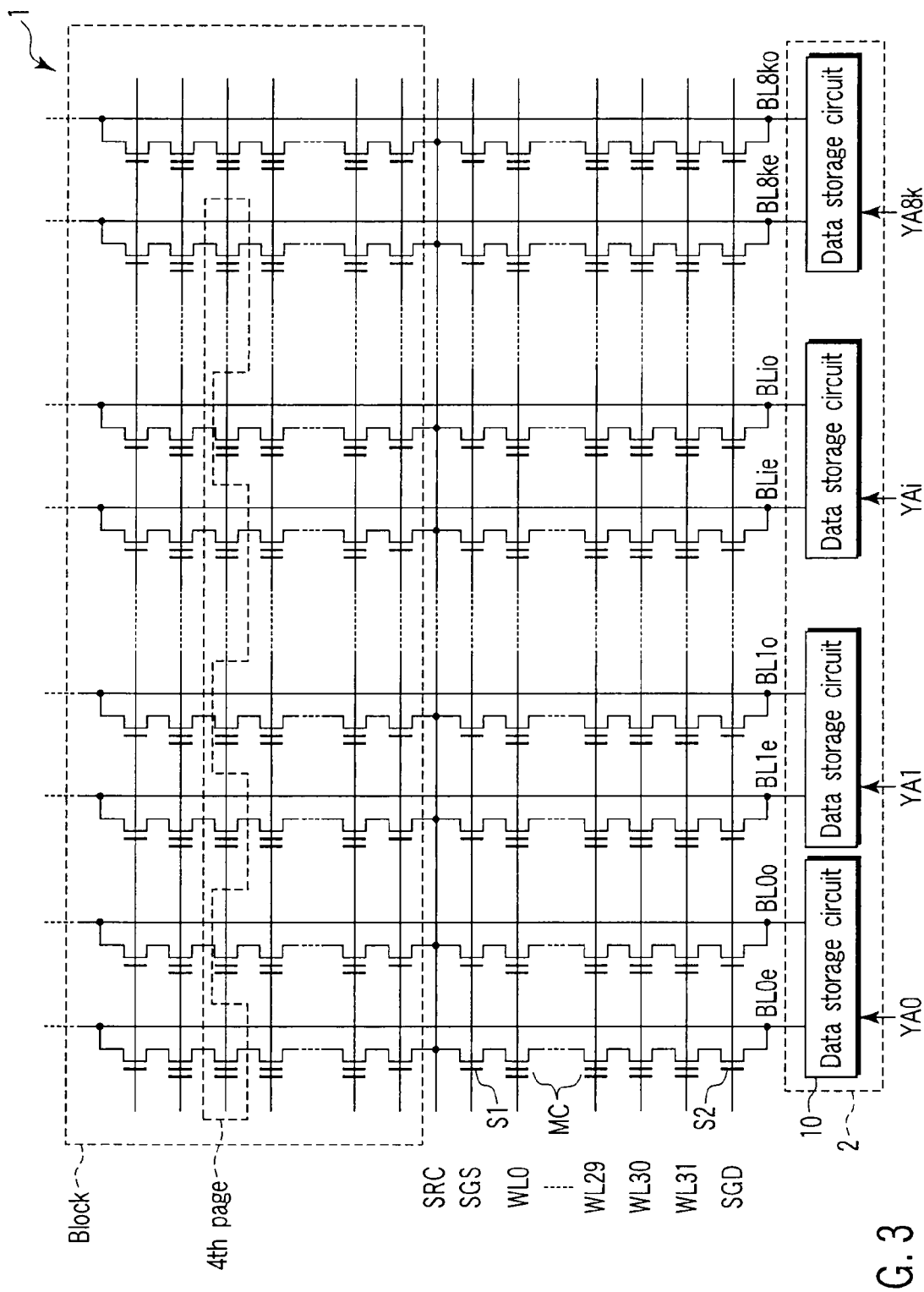
FIG. 3 is a circuit diagram of the memory cell array and bit line control circuit of FIG. 2.

Hereinafter, referring to the accompanying drawings, embodiments of the present invention will be explained.

First Embodiment

FIG. 2 shows a configuration of a semiconductor memory device according to a first embodiment of the present invention. Specifically, FIG. 2 shows a configuration of a NAND flash memory which stores, for example, 16-valued (or 4-bit) data.

A memory cell array 1 includes a plurality of bit lines, a plurality of word lines, and a common source line. In the memory cell array 1, electrically rewritable memory cells made up of, for example, EEPROM cells are arranged in a matrix. A bit line control circuit 2 for controlling bit lines and a word line control circuit 6 are connected to the memory cell array 1.

The bit line control circuit 2 reads the data in a memory cell of the memory cell array 1 via a bit line, detects the state of a memory cell of the memory cell array 1 via a bit line, and writes data into a memory cell of the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into the data storage circuit is output via the data input/output buffer 4 from a data input/output terminal to the outside.

The write data input from the outside to the data input/output terminal 5 is input via the data input/output buffer 4 to the data storage circuit selected by the column decoder 3.

The word line control circuit 6 is connected to the memory cell array 1. The word line control circuit 6 selects a word line in the memory cell array 1 and applies to the selected word line a voltage necessary for a read, write, or erase operation.

The memory cell array 1, bit line control circuit 2, column decoder 3, data input/output buffer 4, and word line control circuit 6 are connected to and controlled by a control signal and control voltage generating circuit 7. The control signal and control voltage generating circuit 7 is connected to a control signal input terminal 8 and is controlled by a control signal input via the control signal input terminal 8 from the outside.

The bit line control circuit 2, column decoder 3, word line control circuit 6, and control signal and control voltage generating circuit 7 constitute a write circuit and a read circuit.

The memory cell array 1 has a ROM section 1-1 acting as electric fuses. Like the memory cell array, the ROM section 1-1 is composed of EEPROM cells. As described later, the ROM section 1-1 stores parameter data for generating a verify read voltage and a data read voltage.

Moreover, the control signal and control voltage generating circuit 7 has an arithmetic circuit 21 and a voltage generating circuit 31 as described later. The arithmetic circuit 21 generates trimming data on the basis of the parameter data supplied from the ROM section 1-1. The voltage generating circuit 31 generates a verify read voltage and a data read voltage on the basis of the trimming data.

FIG. 3 shows a configuration of the memory cell array 1 and bit line control circuit 2 shown in FIG. 2. In the memory cell array 1, a plurality of NAND cells are arranged. A NAND cell is composed of, for example, a memory cell MC made up of, for example, 32 EEPROMs connected in series and select gates S1, S2. Select gate S2 is connected to bit line BL0e and select gate S1 is connected to a source line SRC. The control gates of the memory cells MC arranged in each row are connected equally to word lines WL0 to WL29, WL30, WL31. Select gates S2 are connected equally to select line SGD. Select gates S1 are connected equally to select line SGS.

The bit line control circuit 2 has a plurality of data storage circuits 10. Pairs of bit lines (BL0e, BL0o), (BL1e, BL1o), . . . , (BLie, BLio), (BL8ke, BL8ko) are connected to the individual data storage circuits 10.

The memory cell array 1 includes a plurality of blocks as shown by a broken line. Each block is composed of a plurality of NAND cells. In the memory cell array 1, data is erased in, for example, blocks. In addition, an erase operation is carried out simultaneously on the two bit lines connected to the data storage circuit 10.

A plurality of memory cells (or the memory cells enclosed by a broken line) arranged for every other bit line and connected to one word line constitute one sector. Data is written or read in sectors.

In a read operation, a program verify operation, and a program operation, one of the two bit lines (BLie, BLio) connected to the data storage circuit 10 is selected according to the address signal (YA0, YA1, . . . , YAi, . . . , YA8k) supplied from the outside. Furthermore, one word line is selected according to an external address.

FIGS. 4A and 4B show a sectional view of a memory cell and that of a select transistor, respectively. FIG. 4A shows a memory cell. In a substrate 51 (or a p-well region 55 explained later), an n-type diffused layer 42 is formed as the source and drain of a memory cell. Above a p-well region 55, a floating gate (FG) 44 is formed via a gate insulating film 43. Above the floating gate 44, a control gate (CG) is formed via an insulating film 45. FIG. 4B shows a select gate. In the p-well region 55, an n-type diffused layer 47 acting as a source and a drain has been formed. Above the p-well well region 55, a control gate 49 is formed via a gate insulating film 48.

Figure 5:
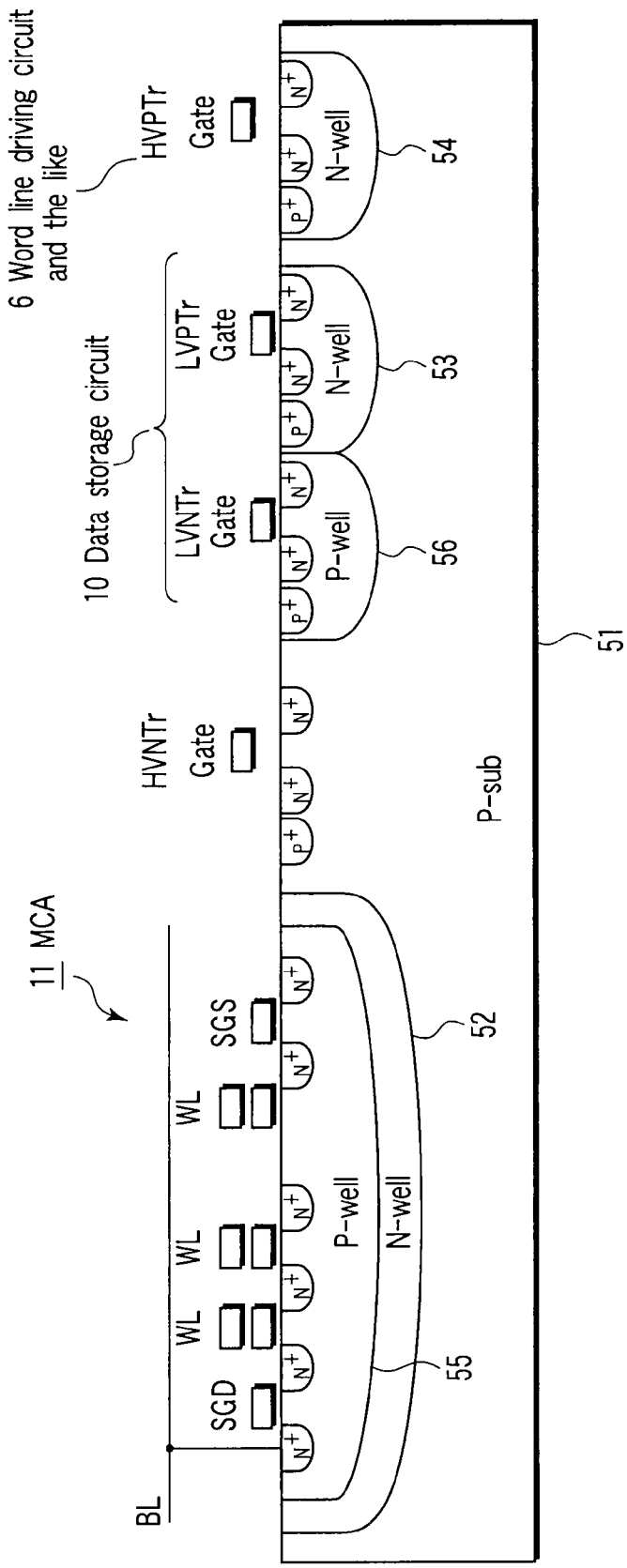
FIG. 5 is a sectional view of a semiconductor memory device to which the present invention is applied.

FIG. 5 is a sectional view of a semiconductor memory device. For example, in a p-type semiconductor substrate 51, n-well regions 52, 53, 54 and p-well regions 55, 56 are formed. In the n-well region 52, the p-well region 55 is formed. In the p-well region 55, low-voltage n-channel transistors LVNTr constituting the memory cell array 1 are formed. In the n-well region 5 and p-well region 56, a low-voltage n-channel transistor LVNTr and a low-voltage p-channel transistor LVPTr constituting a data storage circuit 10 are formed respectively. In the substrate 51, a high-voltage n-channel transistor HVNTr connecting a bit line and the data storage circuit 10 is formed. In the n-well region 54, a high-voltage p-channel transistor HVPTr constituting, for example, a word-line driving circuit or the like is formed. As shown in FIG. 5, the high-voltage transistors HVNTr, HVPTr have, for example, a thicker gate insulating film than that of the low-voltage transistors LVNTr, LVPTr.

FIG. 6 is a circuit diagram of the data storage circuit 10 shown in FIG. 3.

FIG. 6 shows a case where, for example, 4-bit, 16-valued data is written and read. The data storage circuit 10 includes a primary data cache (PDC), a secondary data cache (SDC), a dynamic data cache (DDC), and a temporary data cache (TDC). The SDC, PDC, and DDC hold the input data in a write operation, hold the read-out data in a read operation, hold the data temporarily in a verify operation, and is used for the manipulation of internal data in storing multivalued data.

The TDC amplifies the data on a bit line and holds the data temporarily in a data read operation, and is used for the manipulation of internal data in storing multivalued data.

The SDC is composed of clocked inverter circuits 61a, 61b constituting a latch circuit and transistors 61c, 61d. The transistor 61c is connected between the input end of the clocked inverter circuit 61a and the input end of the clocked inverter circuit 61b. A signal EQ2 is supplied to the gate of the transistor 61c. The transistor 61d is connected between the output end of the clocked inverter circuit 61a and the ground. A signal PRST is supplied to the gate of the transistor 61d. Node N2a of the SDC is connected via a column select transistor 61e to an input/output data line IOn. Node N2b of the SDC is connected via a column select transistor 61f to an input/output data line IO. A column select signal CSLi is supplied to the gates of the transistors 61e, 61f. Node N2a of the SDC is connected to node N1a of the PDC via transistors 61g, 61h. A signal BLC2 is supplied to the gate of the transistor 61g. A signal BLC1 is supplied to the gate of the transistor 61h.

The PDC is composed of clocked inverter circuits 61i, 61j and a transistor 61k. The transistor 61k is connected between the input end of the clocked inverter circuit 61i and the input end of the clocked inverter circuit 61j. A signal EQ1 is supplied to the gate of the transistor 61k. Node N1b of the PCD is connected to the gate of the transistor 61l. One end of the current path of the transistor 61l is connected to the ground via a transistor 61m. A signal CHK1 is supplied to the gate of the transistor 61m. The other end of the current path of the transistor 61l is connected to one end of the current path of transistors 61n, 61o constituting a transfer gate. A signal CHK2n is supplied to the gate of the transistor 61n. The gate of the transistor 61o is connected to node N3. A signal COMi is supplied to the other end of the current path of the transistors 61n, 61o. The signal COMi, which is common to all of the data storage circuits 10, is a signal to indicate whether all of the data storage circuits 10 have been verified. Specifically, as described later, if they have been verified (or the verification has been completed), node N1b of the PDC goes low (or node N1a goes high). In this state, when the signals CHK1, CHK2n are made high, if the verification has been completed, the signal COMi goes high.

Furthermore, the TDC is composed of, for example, a MOS capacitor 61p. One end of the capacitor 61p is connected to a junction node N3 of the transistors 61g, 61h. A signal BOOST explained later is supplied to the other end of the capacitor 61p. The DDC is connected to the junction node N3 via transistors 61qA to 61qD. Signals REGA to REGD are supplied to the gates of the transistors 61qA to 61qD.

The DDC is composed of transistors 61rA to 61rD, 61sA to 61sD. Signals VREGA to VREGD are supplied to one end of the current path of the transistors 61rA to 61rD, respectively. The other ends of the transistors 61rA to 61rD are connected to the current paths of the transistors 61qA to 61qD, respectively. The gates of the transistors 61rA to 61rD are connected to node N1a of the PDC via transistors 61sA to 61sD. Signals DTGA to DTGD are supplied to the gates of the transistors 61sA to 61sD, respectively.

Furthermore, one end of the current path of transistors 61t, 61u is connected to the junction node N3. A signal VPRE is supplied to the other end of the current path of the transistor 61u. A signal BLPRE is supplied to the gate of the transistor 61u. A signal BLCLAMP is supplied to the gate of the transistor 61t. The other end of the current path of the transistor 61t is connected to one end of bit line BLo via a transistor 61v and to one end of bit line BLe via a transistor 61w. One end of bit line BLo is connected to one end of the current path of a transistor 61x. A signal BIASo is supplied to the gate of the transistor 61x. One end of bit line BLe is connected to one end of the current path of a transistor 61y. A signal BIASe is supplied to the gate of the transistor 61y. A signal BLCRL is supplied to the other ends of the current paths of these transistors 61x, 61y. The transistors 61x, 61y are turned on according to signals BIASo, BIASe so as to be complementary to the transistors 61v, 61w, thereby supplying the potential of the signal BLCRL to the unselected bit lines.

Between node N3 and the ground, for example, a MOS capacitor 61z is connected. The capacitor 61z adjusts the potential at node N3 so as to prevent the potential at node N3 from rising too much by coupling in raising the voltage of the capacitor 61p of the TDC explained later by the signal BOOST. Hereinafter, suppose data on the PDC is the potential at node N1a, data on the SDC is the potential at node N2a, data on the TDC is the potential at node N3, and data on the DDC is the potential at node N4.

The individual signals and voltages are generated at the control signal and control voltage generating circuit 7 shown in FIG. 2. Under the control of the control signal and control voltage generating circuit 7, a data write operation, a verify operation, and a read operation are controlled.

The memory stores, for example, 4-bit data in a single cell using 16-valued levels. The switching of the four bits is controlled by addresses (or a first page, a second page, a third page, and a fourth page).

In the first embodiment, the configuration of the data storage circuit of FIG. 6 and its concrete operation will be omitted, because they are unessential.

Figure 7:
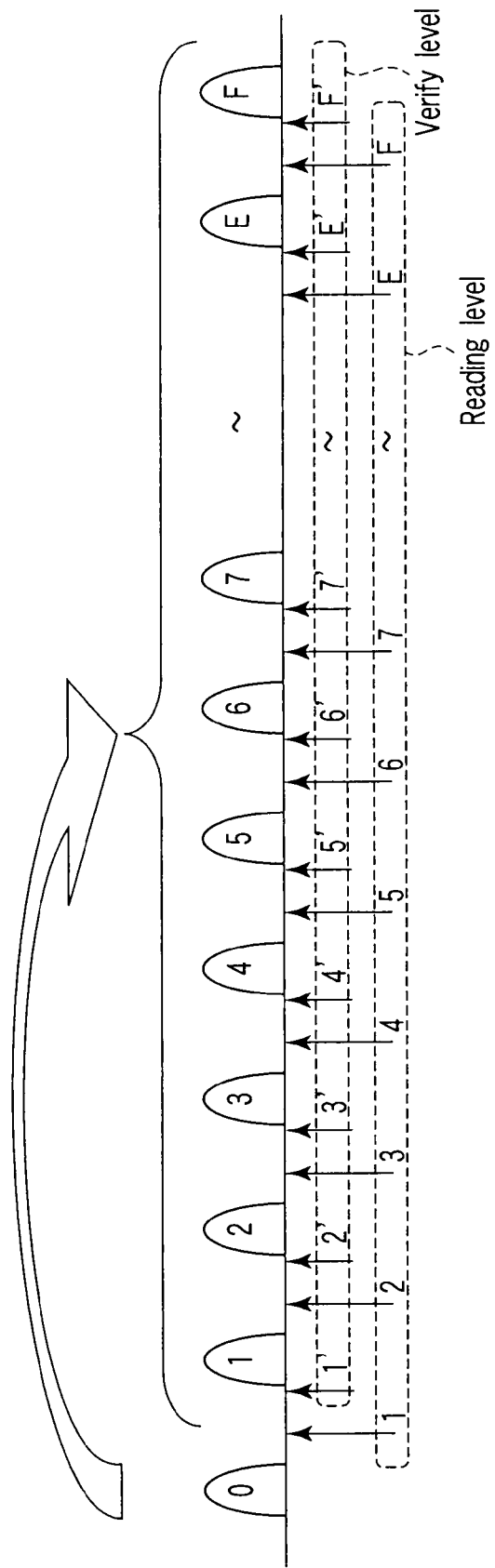
FIG. 7 shows the relationship between the data in a memory cell and the threshold value of the memory cell.

FIG. 7 shows the relationship between the data in a memory cell and the threshold value of the memory cell. When erasing is done, the data in the memory cell becomes "0". In a write operation, the data in the memory cell changes from "1" to "F". Verify reading in a write operation is done using threshold levels "1'" to "F'". A read operation is carried out using threshold levels "1" to "F". The threshold level in a read operation is set slightly lower than the threshold level in a verify read operation. That is, the threshold level in a verify read operation is such that a little margin is set to the threshold level in a read operation.

Figure 9:
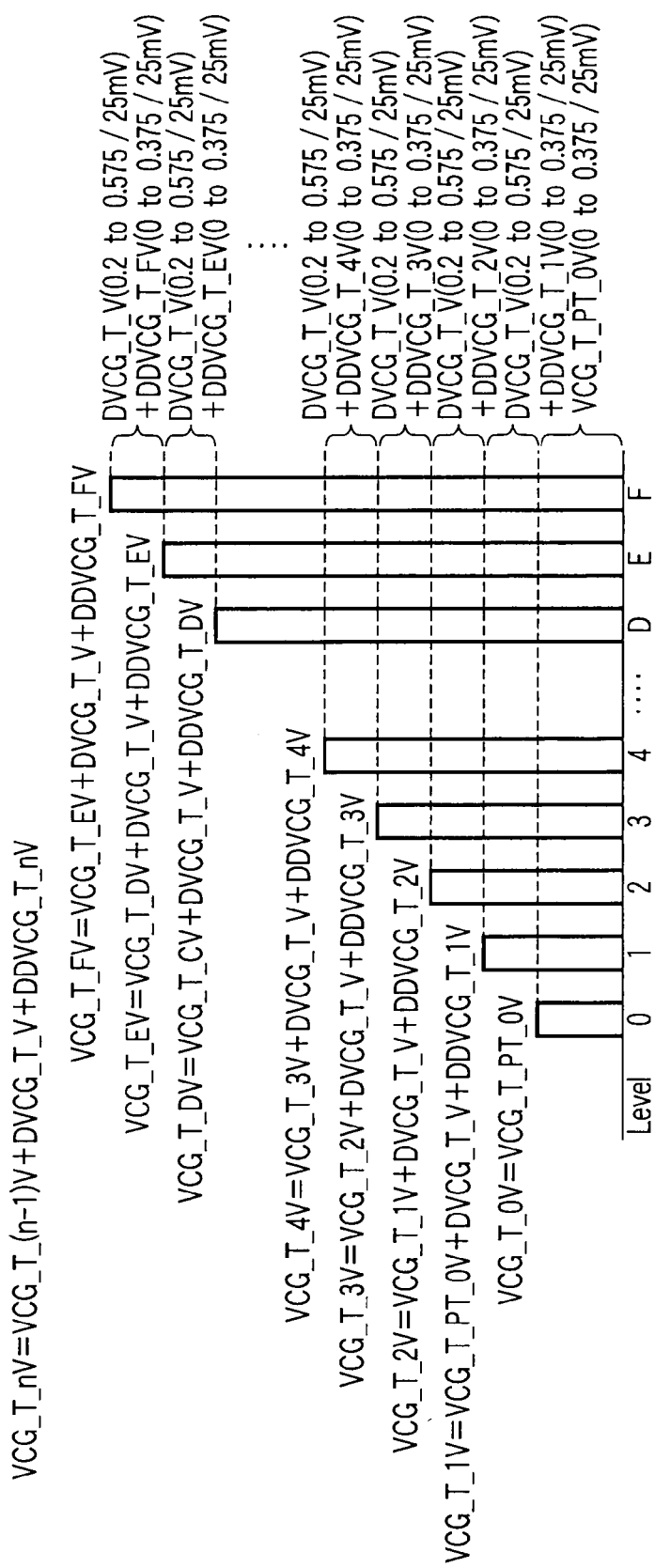
FIG. 9 shows the relationship between the threshold level and the voltage in a verify read operation.

FIGS. 8 and 9 show a method of generating threshold levels in a verify read operation and a read operation. In the first embodiment, the threshold levels in a verify read operation and a read operation are calculated using a plurality of parameters.

Specifically, the threshold level in a verify read operation is calculated on the basis of parameters VCG_T_PT_0V, DVCG_T_V, DDVCG_T_1V to DDVCG_T_FV. Parameter VCG_T_PT_0V, which is the value inherent to the chip, is one of the values set at intervals of 25 mV in the range of, for example, 0V to 0.375V. Parameter DVCG_T_V is one of the values set at intervals of 25 mV in the range of, for example, 0.2V to 0.575V. DDVCG_T_1V to DDVCG_T_FV are 16 values set at intervals of 25 mV in the range of, for example, 0V to 0.375V.

Figure 10:
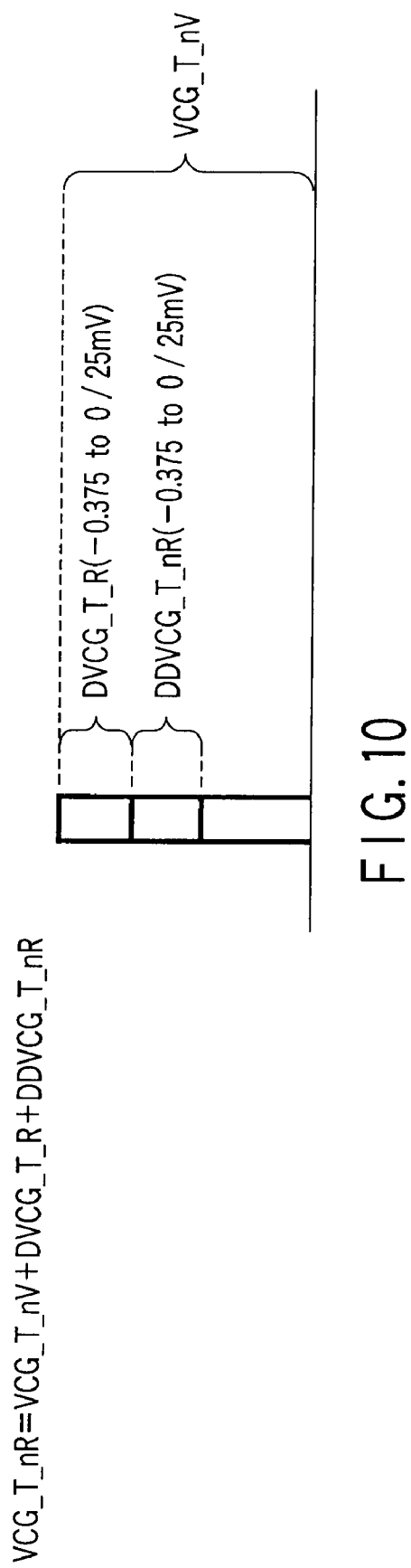
FIG. 10 shows the relationship between the threshold level and the voltage in a read operation.

In addition, as shown in FIGS. 8 and 10, parameters DVCG_T_R and DDVCG_T_1V to DDVCG_T_FR for threshold levels in a read operation are set to the difference between the threshold level in a verify read operation and the threshold level in a read operation. That is, parameter DVCG_T_R is one of the values set at intervals of 25 mV in the range of −0.375V to 0V. DDVCG_T_1R to DDVCG_T_FR are 16 values set at intervals of 25 mV in the range of, for example, −0.375V to 0V.

The parameters VCG_T_PT_0V, DVCG_T_V, DDVCG_T_1V to DDVCG_T_FV, DVCG_T_R, DDVCG_T_1V to DDVCG_T_FR are stored in the ROM section 1-1 of the memory cell array 1 shown in FIG. 2.

As shown in FIG. 9, in a verify read operation, for example, voltage VCG_T_1V of threshold level 1 to voltage VCG_T_FV of threshold level F are determined using the following equations (1):

$$VCG\_T\_1V = VCG\_TPT\_0V + DVCG\_T\_V + DDVCG\_T\_1V \quad (1)$$

$$VCG\_T\_2V = VCG\_T\_1V + DVCG\_T\_V + DDVCG\_T\_2V$$

$$\vdots$$

$$VCG\_T\_FV = VCG\_T\_EV + DVCG\_T\_V + DDVCG\_T\_FV$$

Moreover, in a read operation, for example, voltage VCG_T_1R of threshold level 1 to voltage VCG_T_FR of threshold level F are found by subtracting the difference between the voltage in a verify read operation and the voltage in a read operation from the voltage in a verify read operation as shown in the following equations (2):

$$VCG\_T\_1R = VCG\_T\_1V + DVCG\_T\_R + DDVCG\_T\_1R \quad (2)$$

$$VCG\_T\_2R = VCG\_T\_2V + DVCG\_T\_R + DDVCG\_T\_2R$$

$$\vdots$$

$$VCG\_T\_FR = VCG\_T\_EV + DVCG\_T\_R + DDVCG\_T\_FR$$

In other words, the voltage of each threshold level is obtained by adding the difference which is negative value to the voltage of the verify read operation.

FIG. 1 shows the arithmetic circuit 21 which carries out the above operations. The arithmetic circuit 21 is provided in the control signal and control voltage generating circuit 7 of FIG. 2.

The arithmetic circuit 21 is composed of registers 22-1 to 22-33, 23-1, 23-2, a selector 24, a selector 25, an adder 26, and a register 27. The registers 22-1 to 22-33 hold the verify read parameters VCG_T_PT_0V, DDVCG_T_1V to DDVCG_T_FV, and the read parameters DDVCG_T_1R to DDVCG_T_FR, respectively. The registers 23-1, 23-2 hold the verify read parameter DVCG_T_V and the read parameter DVCG_T_R, respectively. The selector 24, which is connected to the registers 22-1 to 22-33, selects one of them according to a control signal CS1. The selector 25, which is connected to the registers 23-1 to 23-2, selects one of them according to a control signal CS2. The input end of the adder 26 is connected to the output ends of the selector 24 and selector 25 and the output end of the register 27. The output end of the adder 26 is connected to the input end of the register 27.

With the above configuration, when power is applied to the chip, the individual parameters stored in the ROM section 1-1 are read and supplied to the control signal and control voltage generating circuit 7. These parameters are supplied to the corresponding registers of the arithmetic circuit 21. Specifically, the verify read parameters VCG_T_PT_0V, DDVCG_T_1V to DDVCG_T_FV, and the read parameters DDVCG_T_1R to DDVCG_T_FR are held in the registers 22-1 to 22-33. The verify read parameter DVCG_T_V and the read parameter DVCG_T R are held in the registers 23-1, 23-2.

In this state, in a verify read operation, the selectors 24, 25, adder 26, and register 27 operate according to the equations (1), with the result that the parameters corresponding to the verify read voltage are accumulated sequentially.

Moreover, in a read operation, the selectors 24, 25, adder 26, and register 27 operate according to the equations (2), with the result that the parameters corresponding to the read voltage are accumulated sequentially.

The verify read threshold level or read threshold level calculated as described above is supplied as trimming data to the voltage generating circuit 31 of the control signal and control voltage generating circuit 7.

FIG. 11 shows an example of the voltage generating circuit 31. The voltage generating circuit 31 is composed of a reference voltage generating circuit 31-1 and an internal voltage generating circuit 31-2. The reference voltage generating circuit 31-1 is composed of a differential amplifier 32, a p-channel MOS transistor 33, and resistances 34, 35. A reference voltage Vbgr generated by, for example, a bandgap preference circuit (not shown) is supplied to one input end of the differential amplifier 32. The output end of the differential amplifier 32 is connected to the gate of the transistor 33. The source of the transistor 33 is connected to a node to which a power supply Vcc is supplied. The drain of the transistor 33 is connected to one end of the resistance 34. The other end of the resistance 34 is connected not only to the ground via the resistance 35 but also to the other input end of the differential amplifier 32. The reference voltage generating circuit 31-1 outputs a reference voltage Vref slightly higher than the reference voltage Vbgr (e.g., 0.8V to 1.0V). If the resistance values of the resistances 34, 35 are R1 and R2, respectively, the voltage Vref is expressed by the following equation:

$$Vref=(R1+R2)/R2 \times Vbgr$$

On the other hand, the internal voltage generating circuit 31-2 is composed of a differential amplifier 36, a p-channel MOS transistor 37, a resistance 38, a plurality of n-channel MOS transistors 39-1 to 39-$n$, and a decoder 40. The output voltage Vref of the reference voltage generating circuit 31-1 is supplied to one input end of the differential amplifier 36. The output end of the differential amplifier 36 is connected to the gate of the transistor 37. The source of the transistor 37 is connected to a node to which a step-up voltage VCGHH (e.g., 7V) is supplied. The drain of the transistor 37 is connected to the ground via the resistance 38. The intermediate tap of the resistance 38 is connected to the other input end of the differential amplifier 36. The resistance 38 has a plurality of taps between its ends. One end of each of the transistors 39-1 to 39-n is connected to the taps in a one-to-one correspondence. The other ends of the transistors 39-1 to 39-n are connected to an output node VCGRV. The gates of the transistors 39-1 to 39-n are connected to the output ends of the decoder 40. The input end of the decoder 40 is connected to the output end of the arithmetic circuit 21.

With the above configuration, the differential amplifier 36 and transistor 37 generate a voltage corresponding to the resistance ratio of the resistance 38 on the basis of the output voltage Vref of the reference voltage generating circuit 31-1. Moreover, the verify read voltage and trimming data VCG_T_(n)V, R corresponding to the read voltage output from the arithmetic circuit 21 are supplied to the decoder 40. The decoder 40 decodes the trimming data and turns on any one of the transistors 39-1 to 39-n. As a result, the verify read voltage corresponding to the trimming data or read voltage is output at the output end VCGRV.

Figure 12:
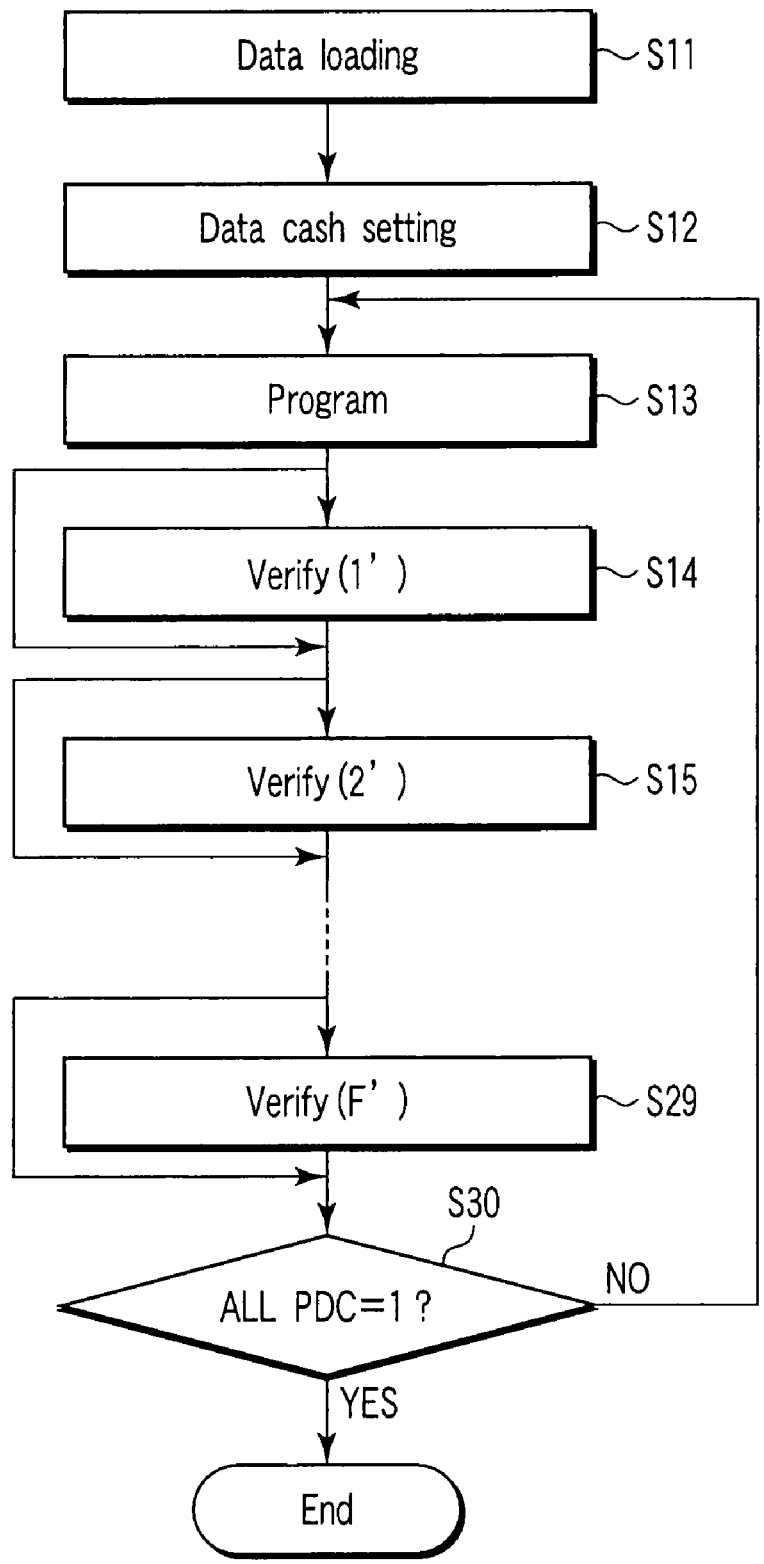
FIG. 12 is a flowchart to explain roughly a program sequence for memory cells.

FIG. 12 schematically shows a program sequence for memory cells. First, referring to FIG. 12, the program sequence will be roughly explained.

Before data is written, an erase operation has been carried out and the threshold voltage of the memory cell has been set to, for example, a negative value. In this state, a first to a fourth page of write data are input from the outside (S11) and a specific values are set in the data caches of the data storage circuits 10 shown in FIGS. 3 and 6 (S12). In FIG. 6, when data is written, node N1$a$ of the PDC is made low. When no data is written, node N1$a$ is made high. Thereafter, the data is written into the memory cell (S13). In this write operation, the data is written simultaneously into the 16-valued or 15-valued levels over four pages.

After the program has ended, a verify operation is executed at, for example, threshold level (1') (S14). At this time, the arithmetic circuit 21 of FIG. 1 generates trimming data VCG_T_1V corresponding to threshold level (1') from the parameters held in a plurality of registers. The trimming data VCG_T_1V is supplied to the decoder 40 of the internal voltage generating circuit 31 of FIG. 11. The decoder 40 decodes the trimming data and selects the corresponding one of the transistors 39-1 to 39-n and turns it on. As a result, a voltage corresponding to threshold level (1') corresponding to the trimming data is generated. If the threshold data of the memory cell has reached threshold level (1'), the node of the PDC goes high, which prevents the data from being written in the next and later programs. However, if the threshold data has not reached threshold level (1'), the node of the PDC remains low, which allows the data to be written in the next and later programs. The program and verify operations are repeated until threshold level (1') has been reached.

Next, a verify operation is executed at threshold level (2') (S15). At this time, the arithmetic circuit 21 of FIG. 1 generates trimming data VCG_T_2V corresponding to threshold level (2') from the parameters held in a plurality of registers. The trimming data VCG_T_2V is supplied to the decoder 40 of the internal voltage generating circuit 31 of FIG. 11. The decoder 40 decodes the trimming data and selects the corresponding one of the transistors 39-1 to 39-n and turns it on. As a result, a voltage corresponding to threshold level (2') corresponding to the trimming data is generated. If the threshold data of the memory cell has not reached threshold level (2'), the program and verify operations are repeated until threshold level (2') has been reached.

Such operations are carried out repeatedly from threshold level (3') to threshold level (F') (S29). When the nodes N1$a$ of the PDCs of all of the data storage circuits 10 have become high, the verify operation is terminated (S30).

Next, in the program sequence, the details of a verify read operation will be explained.

Figure 13:
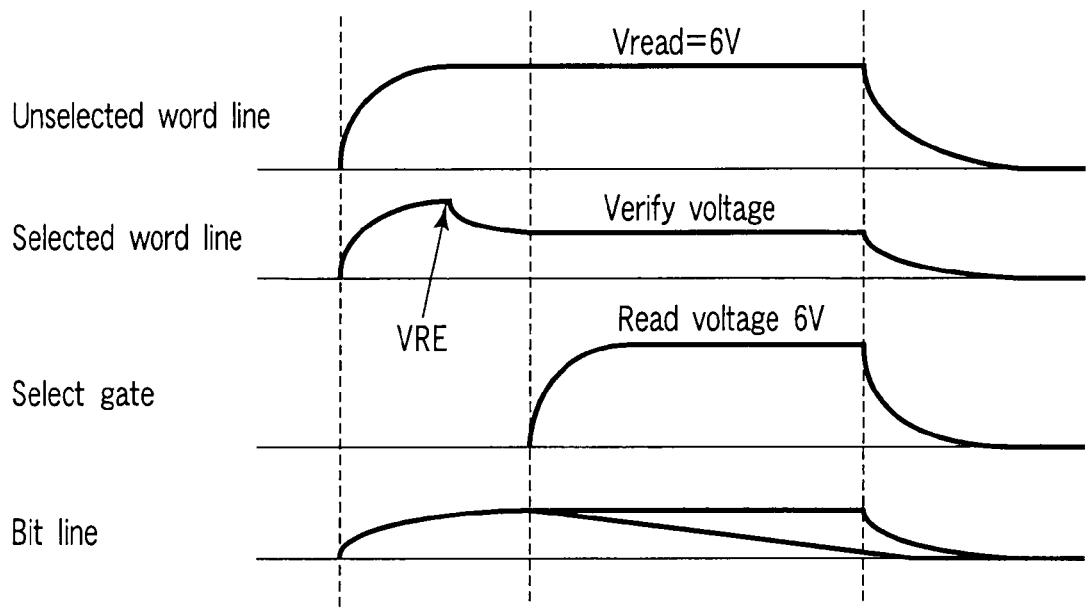
FIG. 13 is a waveform diagram to explain the voltages on a word line and a bit line in a conventional read operation and in a conventional verify read operation.

FIG. 13 shows a waveform on a word line and that on a bit line in a conventional verify read operation. A voltage corresponding to the threshold level for reading the data in the memory cell is supplied to the selected word line and a voltage Vread (e.g., 6V) for turning on the unselected cells is supplied to the unselected word lines. Therefore, the selected word line has a high rising potential VRE as a result of coupling with the unselected word lines. In the meantime, the bit lines are precharged to a specific level (e.g., 0.7V). After the potential on the selected word line has returned from VRE to the specific level, for example, a read voltage of 6V is supplied to the select gate, thereby turning on the select gate. If the cell is on (or if the verify threshold level has not been exceeded), the bit line is discharged. If the cell is off (or if the verify threshold level has been exceeded), the bit line is not discharged and keeps the preceding precharge potential. As described above, in the prior art, the select gate is turned on after the time required for the potential on the selected word line to return from VRE to the specific level has elapsed, resulting in the disadvantage of taking time to carry out a verify operation.

Figure 14:
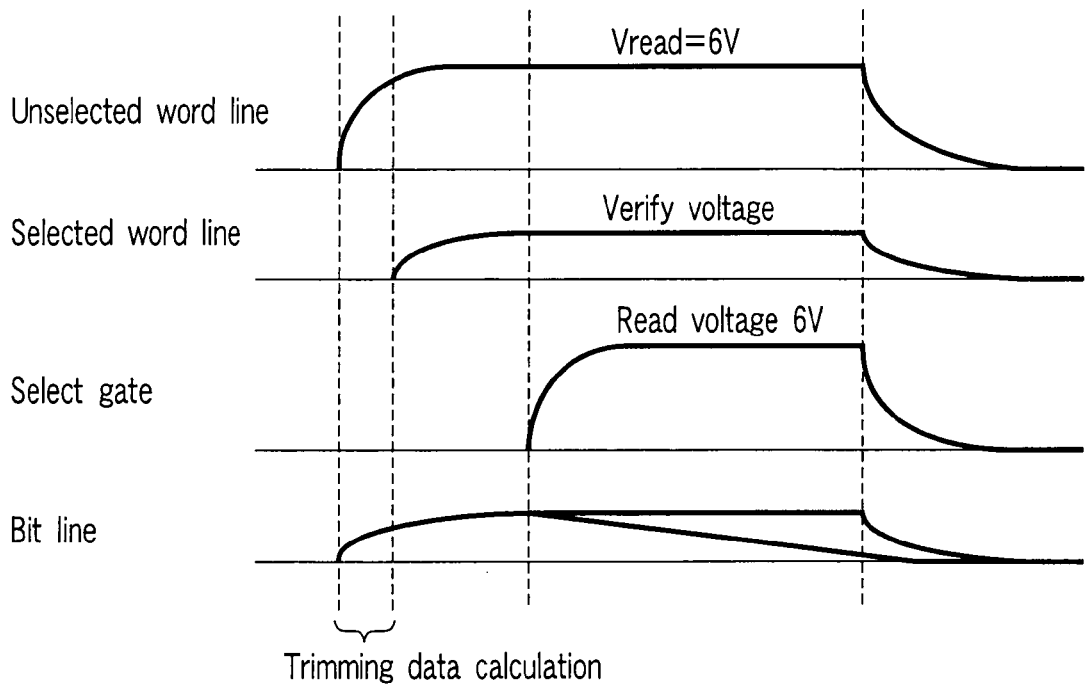
FIG. 14 is a waveform diagram to explain the voltages on a word line and a bit line in a read operation and in a verify read operation in the first embodiment.

On the other hand, FIG. 14 shows a waveform on a word line and that on a bit line in a verify read operation in the first embodiment. In the first embodiment, for example, as soon as the state of verify level (1') shown in FIG. 12 is reached, the unselected word lines are set to the voltage Vread. At the same time, the arithmetic circuit 21 of FIG. 1 calculates trimming data for a verify operation. Thereafter, the verify read voltage is supplied to the selected word line. At this time, since the unselected word lines have been raised to a certain level of potential, the selected word line is less liable to be affected by the potentials of the unselected word lines through coupling. Thereafter, the select gate is turned on. If the cell is on (or if the verify threshold level has not been exceeded), the bit line is discharged. If the cell is off (or if the verify threshold level has been exceeded), the bit line is not discharged and keeps the precharge potential.

Use of such timing control makes it possible to shorten the time required for the potential on the selected word line to become stable. In addition, since trimming data can be calculated during the time from when a potential is supplied to the unselected word lines until a potential is supplied to the selected word line, the useless waiting time can be reduced, which enables a high-speed operation.

At the start of the program, the threshold voltage of the memory cell has not reached a high threshold voltage. Therefore, in verify (1') to verify (F') shown in FIG. 12, for example, verify (7') to verify (F') may not be carried out, or may be skipped. At the end of the program, the verification of low threshold voltages has been completed. Therefore, for example, verify (1') to verify (6') may not be carried out, or may be skipped.

In the above explanation, a verify read operation has been described. The same holds true for a read operation of reading the data stored in a memory cell. Specifically, after the voltage Vread is supplied to the unselected word lines, trimming data for generating a read voltage is calculated and on the basis of the trimming data, a read voltage is generated and supplied to the selected word line. The trimming data in a read operation is calculated on the basis of the trimming data in a verify read operation as described above.

For example, when threshold level 3 is read, the adder 26 of the arithmetic circuit 21 shown in FIG. 1 adds two parameters, DVCG_T_V and DDVCG_T__1V, and determines the result to be VCG_T__1V. Then, the adder 26 adds two parameters, DVCG_T_V and DDVCG_T__2V, to VCG_T__1V and determines the result to be VCG_T__2V. Next, the adder 26 adds two parameters, DVCG_T_V and DDVCG_T__3V to VCG_T__2V and determines the resulting VCG_T__3V, to be verify read trimming data of threshold level 3. Then, the adder 26 adds two parameters, DVCG_T_R and DDVCG_T__3R, to VCG_T__3V and determines the resulting VCG_T__3R to be read trimming data of threshold level 3.

In the first embodiment, the parameters corresponding to the verify read threshold levels and the parameters corresponding to the read threshold levels are stored in the ROM section 1-1 and the parameters stored in the ROM section 1-1 are accumulated by the arithmetic circuit 21, thereby generating verify read trimming data and read trimming data. Therefore, the number of parameters can be reduced as compared with a conventional equivalent and therefore the memory capacity of the ROM section 1-1 and the number of registers can be reduced.

In addition, since the read trimming data is generated on the basis of the verify read trimming data, it has the advantage that the number of parameters corresponding to the read threshold levels can be reduced remarkably.

Furthermore, the selected word line is raised after the unselected word lines are raised and after trimming data is calculated by the arithmetic circuit 21. This prevents the potential on the selected word line from being affected by the potentials of the unselected word lines, which shortens the time required for the potential on the selected word line to become stable. Moreover, since trimming data can be calculated during the time from when a potential is supplied to the unselected word lines until a potential is supplied to the selected word line, the useless waiting time can be reduced, which enables a high-speed operation.

Further, in FIG. 11, the reference voltage generating circuit 31-1 generates the reference voltage Vref which is reduced the influence of the temperature characteristic of the cell. However, it is possible to add temperature dependability to the reference voltage Vref, in order to compensate for the temperature characteristic of the cell. That is, although the reference voltage Vbgr has removed influence of the temperature characteristic of the cell, it may change the reference voltage Vbgr according to the temperature characteristic of the cell.

Second Embodiment

Next, the setting of the above parameters will be explained.

FIG. 15 shows an example of the registers 22-1 to 22-33 shown in FIG. 1. Each of the registers 22-1 to 22-33 is composed of, for example, four flip-flop circuits FF1 to FF4. A clock signal CLK is supplied to the flip-flop circuits FF1 to FF4. Each of the registers 22-1 to 22-33, 23-1, 23-2 carries out the same operation in response to the clock signal CLK as a counter. That is, the flip-flop circuits FF1 to FF4 shift the input signal in response to the clock signal CLK, thereby counting.

The setting of parameters is done at the time of die sort testing in the wafer state. In the die sort testing, trimming is done so that the verify read threshold level and read threshold level output from the chip may become a specific voltage.

That is, first, trimming is done by changing parameter VCG_T_PT__0V so that the voltage of, for example, threshold level 0 for verify reading may become a specific voltage. Specifically, the clock signal is supplied to the flop-flop circuits FF1 to FF4 of the register 22-1, thereby counting up the value of the register. The selector 24 selects the output signal of the register 22-1 and the selector 25 is made unselected. The adder 26 does not perform cumulative addition. Therefore, the output signal of the register 22-1 selected by the selector 24 is supplied via the register 27 to the internal voltage generating circuit 31-2 shown in FIG. 11. The internal voltage generating circuit 31-2 causes the decoder 40 to decode the output signal of the register 22-1 and turns on one of the transistors 39-1 to 39-n according to the decoded output signal. The output voltage of the transistor turned on is supplied to, for example, an external tester (not shown), thereby comparing the output voltage with a reference voltage corresponding to parameter VCG_T_PT__0V. This operation is repeated each time the clock signal is supplied to the flip-flop circuits FF1 to FF4. Then, when the voltage output from the internal voltage generating circuit 31-2 coincides with the reference voltage corresponding to parameter VCG_T_PT__

0V, the clock signal is stopped and the count of the flip-flop circuits FF1 to FF4 is held as parameter VCG_T_PT_0V in the register 22-1.

Parameters DVCG_T_V and DVCG_T_R are set to suitable values in advance. Therefore, trimming is not done on these parameters.

Next, trimming is done on a voltage corresponding to threshold level 1 for verify reading. The trimming is done, beginning with a lower threshold level. Specifically, first, the selector 24 selects VCG_T_PT_0V, the selector 25 is made unselected, and the register 27 is caused to hold VCG_T_PT_0V. Thereafter, the selector 24 selects DDVCG_T_1V and the selector 25 selects DVCG_T_V. The adder 26 adds these. Thus, it follows that the output signal VCG_T_1V of the adder 26=VCG_T_TP_0V+ DVCG_T_V+DDVCG_T_1V. The output signal is supplied via the register 27 to the internal voltage generating circuit 31-2 shown in FIG. 11. The signal supplied to the internal voltage generating circuit 31-2 is decoded at the decoder 40. According to the decoded output signal, one of the transistors 39-1 to 39-n is turned on. The voltage output from the transistor turned on is compared with the reference voltage corresponding to threshold level 1 for verify reading at the tester (not shown).

If the voltage output from the transistor does not coincide with the reference voltage, the signal output from the register 22-2 in response to the clock signal is supplied via the selector 24, adder 26, and register 27 to the decoder 40. According to the decoded output signal of the decoder 40, one of the transistors 39-1 to 39-n is turned on. The voltage output from the internal voltage generating circuit 31-2 is compared with the reference voltage corresponding to threshold level 1 for verify reading at the tester (not shown).

When the above operation is repeated and the voltage output from the internal voltage generating circuit 31-2 coincides with the reference voltage corresponding to threshold level 1 for verify reading, the clock signal CLK is stopped. The count of the flip-flop circuits at that time is held as parameter DDVCG_T_1V in the register 22-2.

The above operation is performed on threshold levels 2 to F for verify reading and threshold levels 1 to F for reading. After the completion of trimming, the parameters held in the individual registers 22-1 to 22-33, 23-1, 23-2 are stored in the ROM section 1-1 of the memory cell 1 via the bit-line control circuit of FIG. 2 and the data storage circuit 10 of FIG. 6.

In the case of a NAND flash memory for storing 16-valued data, trimming has to be done 15 times, beginning with the lowest level. However, the value of parameter DDVCG_T_nV as an increment in each threshold level is smaller than each of parameters VCG_T_PT_0V, DVCG_T_V, and DVCG_T_R. Therefore, it is possible to omit the trimming operation of, for example, threshold levels 2, 3, 5, 6, 9, 10, 11, 12, 14, and performing trimming in a skipping manner, for example, in this order: threshold levels 1, 4, 8, C, and F. In this case, for example, when trimming is performed on threshold level 1, the clock signal is supplied not only to the register 22-2 but also to the registers 22-3, 22-4, thereby causing the registers 22-3, 22-4 to count up at the same time when the register 22-2 counts up. The selector 24 selects the output signal of the register 22-2 and trims threshold level 1 on the basis of the signal. When the trimming of the threshold level 1 is completed and the count held in the register 22-2 is held as parameter DDVCG_T_2V in the register 22-2, the count held in the registers 22-3, 22-4 are held as parameters DEVCG_T_3V, DDVCG_T_4V in the register 22-3, 22-4, respectively. Similarly, parameters for threshold levels 5, 6, 9, 10, 11, 12, 14 are set.

By setting parameters by the above method, it is possible to shorten the time required for trimming.

According to the second embodiment, use of the arithmetic circuit 21 and internal voltage generating circuit 31-2 enables parameters as trimming data to be set. Therefore, parameters can be set without adding a separate circuit, which enables an increase in the chip area to be prevented.

Furthermore, the value of parameter DDVCG_T_nT whose value is small makes it possible to shorten the trimming time more by preventing all from being determined by trimming operations and by allowing a plurality of parameters to share the value of one parameter.

Third Embodiment

FIGS. 16 to 20 show a third embodiment of the present invention.

In the first embodiment, the reference voltage Vref generated by the reference voltage generating circuit 31-1 has been constant and a voltage corresponding to the threshold level has been generated by changing the resistance value of the internal voltage generating circuit 31-2. However, the reference voltage Vref generated by the reference voltage generating circuit 31-1 may be changed, thereby changing the threshold levels as a whole.

FIGS. 16A and 16B show the verify voltage of the first embodiment and a +40% change and a −40% change in the verify voltage. FIGS. 16A and 16B show threshold level 1 to threshold level 8.

Figures 17A, 17B:
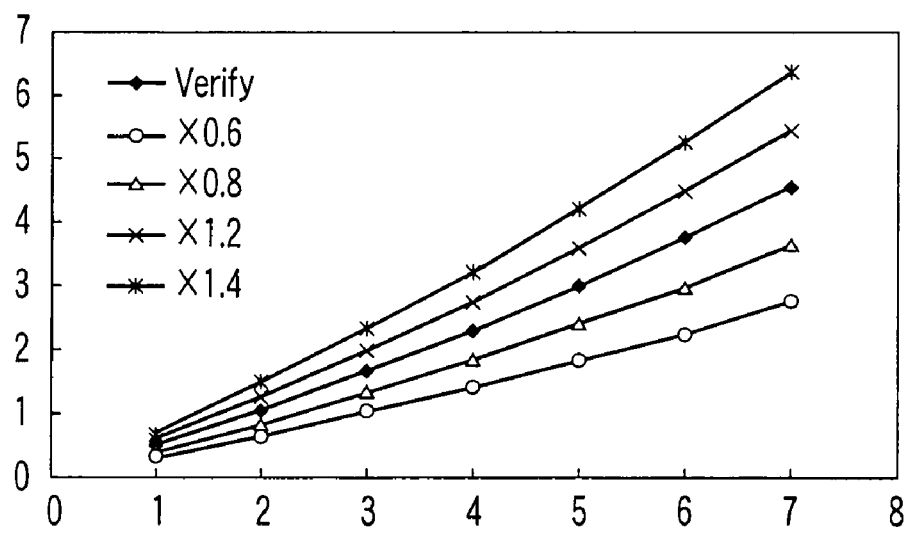
FIG. 17A is a table showing the change of the threshold level when a reference voltage Vref is changed in a third embodiment of the present invention.
FIG. 17B is a graph corresponding to FIG. 17A.

FIGS. 17A and 17B show a case where the reference voltage Vref of the first embodiment is multiplied by 0.6 to 1.4. As seen from FIGS. 16A, 16B, 17A, and 17B, when the reference voltage Vref is changed, the voltage can be shifted more with a larger threshold level than a smaller threshold level.

Figure 18:
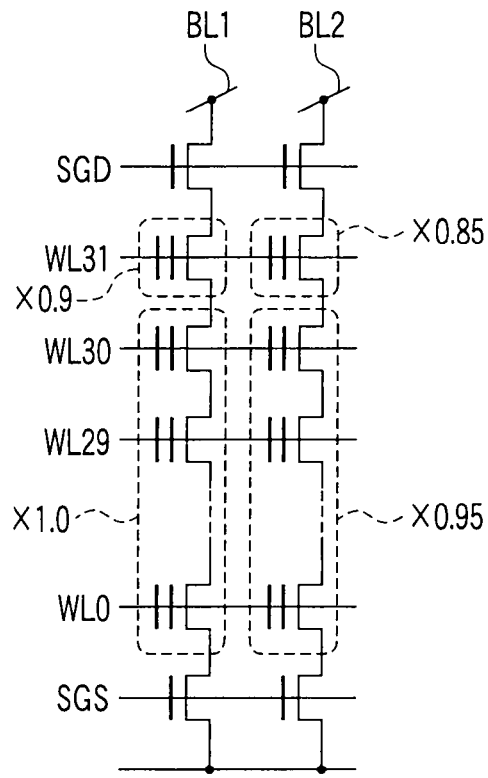
FIG. 18 shows the relationship between the writing position of a NAND cell and the reference voltage Vref in the third embodiment.

In recent years, as a result of the miniaturization of elements, a shift in the threshold distribution caused by the coupling capacitance between cells adjacent to one another in the bit line direction and in the word line direction has become a problem. In a NAND flash memory, writing is done in this order: word line WL0 distant from bit line BL1, BL2 to word line WL31 in a NAND cell as shown in FIG. 18. Since the cell connected to word line WL31 is written into last, a shift in its threshold value caused by the coupling capacitance of the adjacent cells is smaller than that in the threshold value of the cell connected to each of word lines WL0 to WL30. Therefore, it is possible to lower the threshold distribution of word line WL31 as a whole.

Figure 19A:
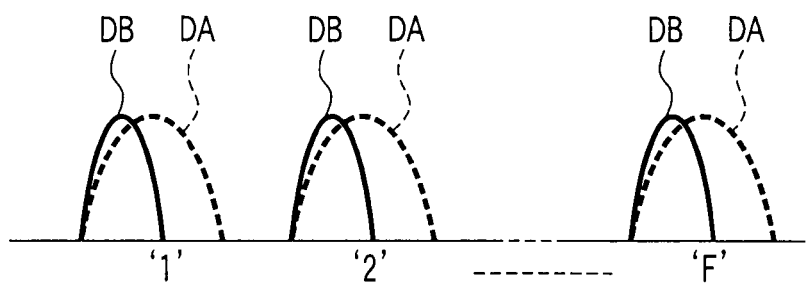
FIG. 19A shows the relationship between the writing position of a NAND cell and the threshold voltage distribution.
Figure 19B:
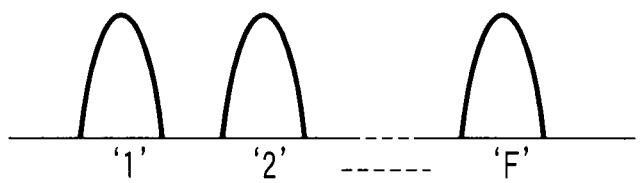
FIG. 19B shows a threshold voltage distribution in the third embodiment.

Specifically, in FIG. 19A, a distribution of the threshold voltages of the memory cells connected to word lines WL0 to WL30 are indicated by DA and a distribution of the threshold voltage of the memory cell connected to word line W31 is indicated by DB. In the case of a distribution of threshold voltages like the distribution DB, there is no problem with a read operation even if the potential between the individual threshold voltages is lowered. Therefore, the level can be lowered as a whole as shown in FIG. 19B.

As described above, when the threshold voltage is lowered as a whole, lowering the reference voltage Vref is effective.

The effect of the coupling capacitance of adjacent cells differs according to the order of writing. Therefore, specifically, for example, as shown in FIG. 18, if the value of the reference voltage Vref when the memory cells connected to word lines WL0 to WL30 in the NAND cell connected to bit line BL1 are written into is set as a reference, it is desirable that the reference voltage when the memory cells connected to word lines WL0 to WL30 in the NAND cell connected to adjacent bit line BL2 are written into should be set to Vref×

0.95, that the reference voltage when the memory cell connected to word line WL31 in the NAND cell connected to bit line BL1 is written into should be set to Vref×0.90, and that the reference voltage when the memory cell connected to word line WL31 in the NAND cell connected to bit line BL2 is written into should be set to Vref×0.85.

FIG. 20 shows an example of the reference voltage generating circuit applied to the third embodiment. In FIG. 20, the same parts as those in FIG. 11 are indicated the same reference numerals.

In FIG. 20, a resistance R1 is provided with a plurality of taps. For example, one end of each of n-channel MOS transistors 51-1 to 51-4 is connected to the corresponding one of the taps. The other ends of the transistors 51-1 to 51-4 are connected to an output node. A control signal MS for setting magnification is supplied to the gates of the transistors 51-1 to 51-4. For example, when data is written into the cell connected to bit line BL2 and word line WL31 shown in FIG. 18, that is, when a voltage of the reference voltage Vref×0.85 is output, the control signal MS supplied to the gate of the transistor 51-4 is made high and the remaining control signals MS are made low. The reference voltage Vref×0.85 generated this way is supplied to the internal voltage generating circuit 31-2 of FIG. 11. The internal voltage generating circuit 31-2 generates a voltage corresponding to each threshold level on the basis of the reference voltage Vref×0.85.

In the third embodiment, the reference voltage generating circuit 31-1 generates a different reference voltage according to the position of a memory cell to be written into. That is, as a cell is closer to a bit line and written into later, the reference voltage is set lower. Therefore, the overall threshold voltage distribution of memory cells less affected by the coupling capacitance between adjacent cells can be decreased. Accordingly, the writing speed can be improved further as compared with cells with a wider threshold voltage distribution.

Moreover, since the potential of the reference voltage Vref is changed, there is no need to change the parameters corresponding to the individual threshold levels. In addition, it is not necessary to set a parameter for each different reference voltage Vref. Accordingly, the advantage is that an increase in the number of parameters can be prevented.

Fourth Embodiment

While in the second embodiment, the setting of parameters has been done by performing trimming for each level, this invention is not limited to this. Parameters may be set using the reference voltage generating circuit 31-1.

Figure 21:
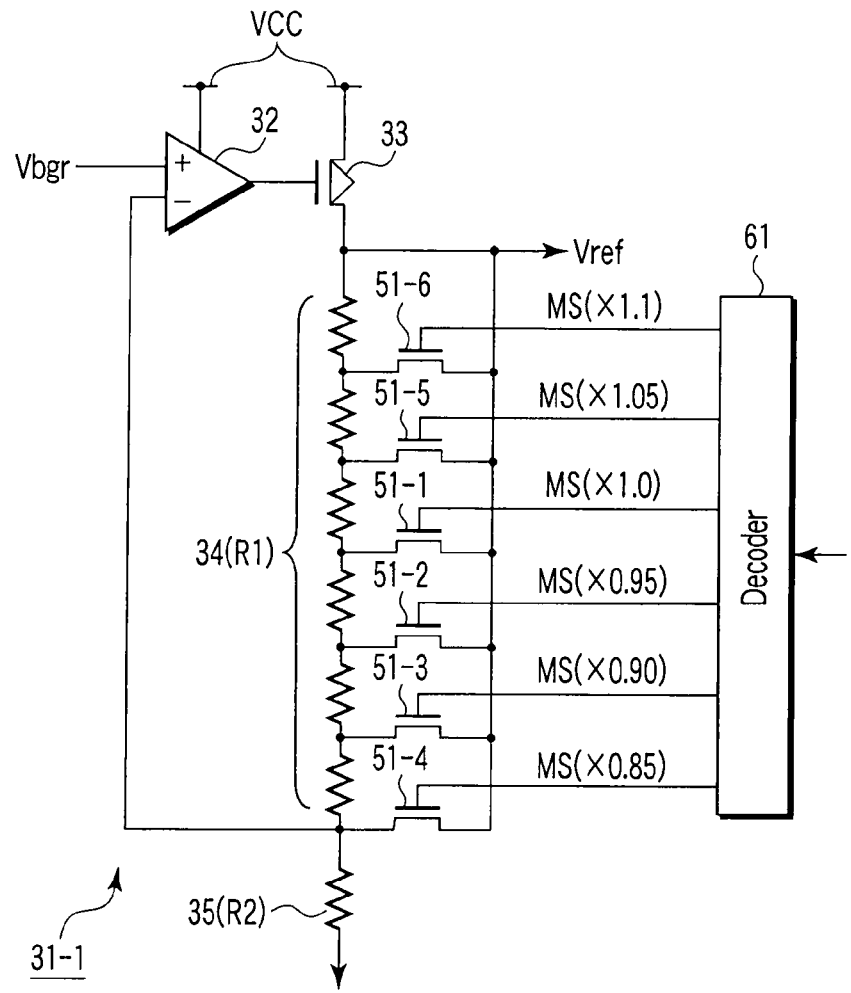
FIG. 21 is a circuit diagram of a reference voltage generating circuit applied to a fourth embodiment of the present invention.
Figure 22:
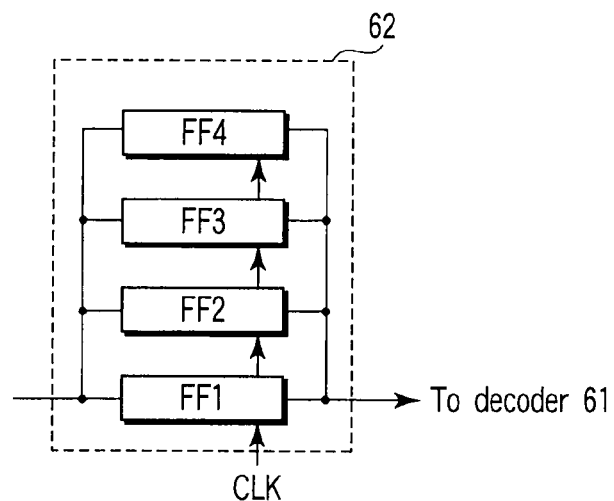
FIG. 22 is a circuit diagram of a register applied to the fourth embodiment.

FIG. 21 shows a fourth embodiment of the present invention, describing a modification of the reference voltage generating circuit 31-1. One end of each of transistors 51-5, 51-6 is connected to the resistance 34. The other ends of these transistors 51-5, 51-6 are connected to an output node. The gates of these transistors 51-5 to 51-6 are connected to the output end of a decoder 61. A plurality of registers 62 composed of a plurality of flip-flop circuits FF1 to FF4 shown in FIG. 22 are connected to the input end of the decoder 61.

With this configuration, a clock signal CLK is supplied to the register, thereby counting the clock signal CLK. The count output signal is supplied to the decoder 61. According to the output signal of the decoder 61, one of the transistors 51-1 to 51-6 is turned on. The reference voltage output from the reference voltage generating circuit 31-1 is supplied to the internal voltage generating circuit 31-2. At this time, only any one of the transistors in the internal voltage generating circuit 31-2 is selected and the output voltage at the output node VCGRV in the internal voltage generating circuit 31-2 is monitored by a tester (not shown). First, the tester is set to a reference voltage corresponding to, for example, reference voltage Vref×0.9. If VCGRV has not reached the reference voltage, the clock signal CLK supplied to the register is incremented. If VCGRV has reached the reference voltage, the value of the register is held. This operation is carried out repeatedly, while increasing the reference voltage in this order:

Vref×0.95, Vref×1.0, Vref×1.05, and Vref×1.1.

In the fourth embodiment, the parameters shown in FIGS. 8 and 15 may be set to suitable values in advance. Trimming the reference voltage as described above enables the parameter for verify reading to be held in the register. Furthermore, as described in the second embodiment, a plurality of parameters are share one parameter and all of the parameters are not determined by trimming operations, thereby shortening the trimming time more.

According to the fourth embodiment, too, it is possible to setting parameters. In addition, since trimming is not done for each threshold level, the advantage is that the time required for trimming can be shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array in which a plurality of memory cells connected to word lines and bit lines are arranged in a matrix; and
a control circuit configured to control a voltage of the word line and the bit line,
wherein the control circuit supplies a first read voltage to a first word line of the word lines when reading data from a memory cell connected to the first word line, and supplies a second read voltage to a second word line of the word lines when reading data from a memory cell connected to the second word line.

2. The device according to claim 1, further comprising:
a voltage generating circuit configured to generate the first and second read voltages based on a reference voltage; and
a regulating circuit configured to regulate the reference voltage,
wherein the regulating circuit outputs a first reference voltage when the first read voltage is generated by the voltage generating circuit and outputs a second reference voltage lower than the first reference voltage when the second read voltage is generated by the voltage generating circuit.

3. A semiconductor memory device comprising:
a memory cell configured to store data by a threshold level;
an arithmetic circuit configured to calculate a voltage data by adding or subtracting first and second parameter data, the first parameter data being data for generating a first level for a first reading or a verify reading, and the second parameter data being data that includes a difference between a second level for a second reading or a verify reading and the first level; and
a voltage generating circuit configured to generate a voltage based on the voltage data calculated by the arithmetic circuit, wherein the first parameter is trimmed to a specific value for generating the first level, and the second parameter data is trimmed to a specific value based on the first parameter data trimmed to a specific value and the voltage data calculated by the arithmetic circuit.

4. The device according to claim 3, further comprising:

a comparing circuit configured to compare the voltage generated by the voltage generating circuit with a voltage input from exterior, the first and second parameter data being trimmed by a comparison result.

5. The device according to claim 3, wherein the arithmetic circuit comprises:

a first register which holds the first parameter data;

a second register which holds the second parameter data;

a select circuit which selects data output from the first and second registers;

an adder which adds the data output from the select circuit; and a third register which accumulates the data output from the adder and has an output end connected to the input end of the adder.

6. The device according to claim 4, wherein the voltage generating circuit comprises:

a decoder which decodes the voltage data supplied from the arithmetic circuit;

a voltage divider circuit which divides a reference voltage; and an output circuit which outputs a voltage divided by the voltage divider circuit according to the output signal of the decoder.

* * * * *